United States Patent
Depres et al.

(10) Patent No.: US 9,648,751 B2
(45) Date of Patent: May 9, 2017

(54) METHOD FOR PRODUCING A SHEET

(71) Applicant: ARJO WIGGINS FINE PAPERS LTD., Manchester (GB)

(72) Inventors: Gaël Depres, Chirens (FR); Jean-Marie Vau, Paris (FR)

(73) Assignee: ARJO WIGGINS FINE PAPERS LIMITED, Manchester (GB)

( * ) Notice: Subject to any disclaimer, the term of this patent is extended or adjusted under 35 U.S.C. 154(b) by 0 days.

(21) Appl. No.: 14/365,562

(22) PCT Filed: Dec. 21, 2012

(86) PCT No.: PCT/EP2012/076829
§ 371 (c)(1),
(2) Date: Jun. 13, 2014

(87) PCT Pub. No.: WO2013/104520
PCT Pub. Date: Jul. 18, 2013

(65) Prior Publication Data
US 2014/0322500 A1    Oct. 30, 2014

(30) Foreign Application Priority Data

Jan. 13, 2012 (FR) ..................... 12 50366
Jul. 2, 2012 (FR) ..................... 12 56336

(51) Int. Cl.
*B44C 1/165* (2006.01)
*B44C 1/17* (2006.01)
(Continued)

(52) U.S. Cl.
CPC .............. *H05K 3/02* (2013.01); *B32B 29/06* (2013.01); *B41M 1/22* (2013.01); *D21H 27/00* (2013.01);
(Continued)

(58) Field of Classification Search
USPC ........ 156/230, 241, 247, 249, 250, 256, 277
See application file for complete search history.

(56) References Cited

U.S. PATENT DOCUMENTS 4,292,397 A * 9/1981 Takeuchi .............. G03F 7/0752
                                                         101/456
4,349,402 A    9/1982 Parker
(Continued)

FOREIGN PATENT DOCUMENTS

DE    2747241 A1    4/1979
DE    69207751 T2    2/1997
(Continued)

OTHER PUBLICATIONS

Office Action dated Nov. 18, 2015, issued in co-pending U.S. Appl. No. 13/515,471 (6 pages).
(Continued)

*Primary Examiner* — Sing P Chan
(74) *Attorney, Agent, or Firm* — Westerman, Hattori, Daniels & Adrian, LLP

(57) ABSTRACT

The method for producing a electroconductive sheet having a substrate, in particular made of paper, and an electroconductive layer include the steps of: a/ preparing a multi-layer structure with an anti-adhesive coating inserted between a plastic film and a base layer, b/ cross-laminating the multi-layer structure and the substrate, and c/ removing the plastic film and the anti-adhesive coating from the base layer. The base layer is a layer of an electroconductive material or is covered with an electroconductive layer by an additional step consisting of: d1/ depositing an electroconductive film on the base layer; or d2/ printing the base layer with at least one ink having electrical properties, with the base layer
(Continued)

being a printable layer with a binder base of which the rate is 15% greater in dry weight in relation to the total dry matter weight of this layer.

24 Claims, 6 Drawing Sheets

(51) Int. Cl.
| | |
|---|---|
| B29C 65/54 | (2006.01) |
| B32B 37/12 | (2006.01) |
| B32B 37/26 | (2006.01) |
| B32B 38/10 | (2006.01) |
| B32B 38/14 | (2006.01) |
| H05K 3/02 | (2006.01) |
| B32B 29/06 | (2006.01) |
| B41M 1/22 | (2006.01) |
| D21H 27/00 | (2006.01) |
| H05K 3/20 | (2006.01) |
| H05K 1/03 | (2006.01) |
| H05K 3/38 | (2006.01) |
| H05K 1/16 | (2006.01) |

(52) U.S. Cl.
CPC .......... *H05K 1/0386* (2013.01); *H05K 3/027* (2013.01); *H05K 3/207* (2013.01); *H05K 3/381* (2013.01); *H05K 1/16* (2013.01); *Y10T 428/24802* (2015.01)

(56) References Cited

U.S. PATENT DOCUMENTS

| | | | |
|---|---|---|---|
| 4,733,247 A | 3/1988 | Arai et al. | |
| 4,867,844 A | 9/1989 | Dessauer | |
| 5,256,621 A | 10/1993 | Yasuda et al. | |
| 5,356,853 A | 10/1994 | Saito et al. | |
| 5,593,939 A | 1/1997 | Saito et al. | |
| 5,726,122 A | 3/1998 | Saito et al. | |
| 5,985,425 A * | 11/1999 | Tomizawa | B41M 5/506 |
| | | | 347/105 |
| 6,177,187 B1 | 1/2001 | Niemoller et al. | |
| 6,215,508 B1 | 4/2001 | Bryan et al. | |
| 6,280,827 B1 | 8/2001 | Kume et al. | |
| 6,358,660 B1 | 3/2002 | Agler et al. | |
| 6,410,097 B2 * | 6/2002 | Kume | 162/135 |
| 6,450,633 B1 * | 9/2002 | Kronzer | B41M 5/52 |
| | | | 347/105 |
| 6,497,781 B1 | 12/2002 | Dalvey et al. | |
| 6,513,434 B1 * | 2/2003 | Nakazawa | B41C 1/1066 |
| | | | 101/466 |
| 7,189,676 B2 | 3/2007 | Bourdelais et al. | |
| 2001/0009696 A1 | 7/2001 | Kume et al. | |
| 2002/0006869 A1 | 1/2002 | Tajiri et al. | |
| 2002/0022118 A1 * | 2/2002 | Sarkar | B41M 5/504 |
| | | | 428/32.22 |
| 2003/0017321 A1 * | 1/2003 | Iwasa | B41M 5/508 |
| | | | 428/308.4 |
| 2003/0137579 A1 * | 7/2003 | Tamura | B41M 5/38257 |
| | | | 347/217 |
| 2003/0224150 A1 * | 12/2003 | Ludwig | B41M 5/5281 |
| | | | 428/195.1 |
| 2005/0167035 A1 | 8/2005 | Laskey et al. | |
| 2006/0055169 A1 | 3/2006 | Reinhart | |
| 2006/0073417 A1 * | 4/2006 | Hermesdorf | B41M 5/52 |
| | | | 430/302 |
| 2008/0036197 A1 | 2/2008 | Brehm et al. | |
| 2008/0187651 A1 * | 8/2008 | Lee | C09D 11/52 |
| | | | 427/77 |
| 2008/0264682 A1 | 10/2008 | Catron et al. | |
| 2009/0008028 A1 | 1/2009 | Reschke et al. | |
| 2009/0061159 A1 | 3/2009 | Staub et al. | |
| 2009/0233015 A1 | 9/2009 | Fujimoto et al. | |
| 2009/0301649 A1 | 12/2009 | Augsberg et al. | |
| 2010/0078208 A1 * | 4/2010 | Inoue | H05K 3/246 |
| | | | 174/261 |
| 2011/0079344 A1 | 4/2011 | Sheu | |
| 2012/0308744 A1 | 12/2012 | Depres et al. | |
| 2014/0290520 A1 * | 10/2014 | Frenkel | G03F 7/11 |
| | | | 101/483 |

FOREIGN PATENT DOCUMENTS

| | | |
|---|---|---|
| DE | 19628341 A1 | 1/1998 |
| EP | 0038878 A1 | 11/1981 |
| EP | 0062967 A2 | 10/1982 |
| EP | 0 454 428 A1 | 10/1991 |
| EP | 0 474 494 A2 | 3/1992 |
| EP | 0474494 A2 | 3/1992 |
| EP | 1035504 A1 | 9/2000 |
| EP | 1584647 A1 | 10/2005 |
| EP | 2 045 090 A1 | 4/2009 |
| EP | 2045090 A1 | 4/2009 |
| GB | 2006109 A | 5/1979 |
| JP | S61-290085 A | 12/1986 |
| JP | S62-211195 A | 9/1987 |
| JP | H02-205311 A | 8/1990 |
| JP | H04-363292 A | 12/1992 |
| JP | H06-297865 A | 10/1994 |
| JP | 07-156532 A | 6/1995 |
| JP | H10-250245 A | 9/1998 |
| JP | 2000-001097 A | 1/2000 |
| JP | 2003-533554 A | 11/2003 |
| JP | 2004-265827 A | 9/2004 |
| JP | 2005-507452 A | 3/2005 |
| JP | 2006-026522 A | 2/2006 |
| JP | 2006-516819 A | 7/2006 |
| JP | 2006-521023 A | 9/2006 |
| JP | 2009-520251 A | 5/2009 |
| JP | 2010-512010 A | 4/2010 |
| JP | 2011-520241 A | 7/2011 |
| TW | 200950607 A | 12/2009 |
| WO | 93/16888 A1 | 9/1993 |
| WO | 0174952 A1 | 10/2001 |
| WO | 03/020519 A1 | 3/2003 |
| WO | 03038002 A1 | 5/2003 |
| WO | 03/097378 A2 | 11/2003 |
| WO | 2004037646 A2 | 5/2004 |
| WO | 2004068536 A2 | 8/2004 |
| WO | 2004080138 A1 | 9/2004 |
| WO | 2005095118 A2 | 10/2005 |
| WO | 2006/076613 A2 | 7/2006 |
| WO | 2006108607 A2 | 10/2006 |
| WO | 2007045431 A1 | 4/2007 |
| WO | 2007/070391 A1 | 6/2007 |
| WO | 2007073833 A1 | 7/2007 |
| WO | 2008/070532 A2 | 6/2008 |
| WO | 2009099707 A1 | 8/2009 |
| WO | 2009118761 A2 | 10/2009 |
| WO | 2012/031096 A2 | 3/2012 |

OTHER PUBLICATIONS

U.S. Final Office Action dated Feb. 25, 2015, issued in co-pending U.S. Appl. No. 13/515,471 (21 pages).
Office Action dated Jul. 28, 2014, issued in co-pending U.S. Appl. No. 13/515,471.
International Search Report of PCT/FR2010/052879, mailing date Apr. 12, 2011, corresponding to co-pending U.S. Appl. No. 13/515,471.
Restriction Requirement dated Dec. 2, 2013, issued in co-pending U.S. Appl. No. 13/515,471.
Restriction Requirement dated Mar. 11, 2014, issued in co-pending U.S. Appl. No. 13/515,471.
International Search Report dated Apr. 12, 2013 issued in corresponding application No. PCT/EP2012/076829.
Office Action dated Oct. 31, 2013, issued in counterpart Japanese application No. 2012-545398 of co-pending U.S. Appl. No. 13/515,471 (w/ English partial translation, and machine translation) (11 pages).

(56) References Cited

OTHER PUBLICATIONS

Office Action dated Oct. 15, 2014, issued in counterpart Japanese application No. 2012-545398 of co-pending U.S. Appl. No. 13/515,471 (w/ English partial translation, and machine translation) (10 pages).
Office Action dated Jul. 24, 2015, issued in counterpart Japanese application No. 2012-545398 of co-pending U.S. Appl. No. 13/515,471 (w/ English partial translation, and machine translation) (8 pages).
Opponent's Brief filed on May 6, 2015 in opposition to European Patent No. 2 516 741B1 issued from counterpart European Patent Appl. No. 10809308.9 of co-pending U.S. Appl. No. 13/515,471 (w/ English translation, 50 pages).
"Glanzmessgerät". wikipedia.de [online]. Retrieved May 5, 2015 from https://de.wikipedia.org/wiki/Glanzmessger%C3%A4t (w/ English partial translation and partial machine translation based on the Sep. 3, 2014 version of the article, 8 pages). Cited as B01 in Opponent's Brief and E26 in Proprietor's Reply.
"Spiegel". wikipedia.de [online]. Retrieved May 5, 2015 from https://de.wikipedia.org/wiki/Spiegel (w/ English partial translation and partial machine translation based on the Apr. 27, 2015 version of the article, 31 pages). Cited as B02 in Opponent's Brief and E27 in Proprietor's Reply.
"Indigo digital press". wikipedia.com [online]. Retrieved Nov. 12, 2015 from https://en.wikipedia.org/wiki/Indigo_Digital_Press (in English, 5 pages). Cited as E28 in Proprietor's Reply.
Advantage MG White Gloss paper. Datasheet [online]. Mondi. Retrieved Dec. 16, 2015 from http://www.mondigroup.com/products/PortalData/1/Resources/products_services/packaging/kraft_papers/kraft_paper/2012/Advantage_MG_White_Gloss_Data_Sheet_2012.pdf (in English, 2 pages). Cited as E29 in Proprietor's Reply.
Alaska Plus Coated Folding Boxboard. Datasheet [online]. International Paper. Retrieved Dec. 16, 2015 from http://www.internationalpaper.com/Apps/Alaska-Plus/files/technical/Alaska%20Plus%20technical%20datasheet%20FR.pdf (w/ English translation, 2 pages). Cited as E30 in Proprietor's Reply.
AP-Tec Liner paper. Datasheet [online]. Arctic Paper. Retrieved Dec. 16, 2015 from http://www.arcticpaper.com/Global/APTec/Global%20files/SHORT_ENG_APTecLiner_140227.pdf (in English, 1 page). Cited as E31 in Proprietor's Reply.
Duplex Coated Board with Grey Back. Datasheet [online]. Atrak Pulp & Paper. Retrieved Dec. 16, 2015 from http://www.atrak-pp.com/download/Spec_Ctd%20Duplex_Bd(GB).pdf (in English, 1 page). Cited as E32 in Proprietor's Reply.
Condat gloss paper. Datasheet [online]. Condat. Retrieved Dec. 16, 2015 from http://www.condat-pap.com/pdf_tech/CondatGloss.pdf (in English, 1 page). Cited as E33 in Proprietor's Reply.
Proprietor's Reply filed on Jan. 4, 2016 in response to Opponent's Brief (w/ English translation, 43 pages).
Notice of Allowance dated Apr. 12, 2016, issued in co-pending U.S. Appl. No. 13/515,471 (without returned SB08; 8 pages).
Taiwanese Office Action dated Mar. 24, 2016 in Taiwanese Application No. 102100911, counterpart of co-pending U.S. Appl. No. 14/365,562; with English translation (14 pages).
Japanese Office Action dated Aug. 25, 2016 in counterpart Japanese application No. 2014-551565; with English partial translation and partial machine-translation (11 pages) (WO2007070391A1 corresponding to JP2009-520251 (D3 in the Japanese Office Action) and WO2008070532A2 corresponding to JP2010-512010 (D4 in the Japanese Office Action) are not listed in this IDS since they were already listed in the IDS filed on Jun. 13, 2014).

* cited by examiner

METHOD FOR PRODUCING A SHEET

This invention relates to a method for producing an electroconductive sheet, this sheet comprising a substrate, in particular made of paper, and an electroconductive layer. This invention further relates to a method for producing a sheet, of which one side comprises a zone of greater smoothness than the rest of the side, this zone comprising a smooth external layer which extends on a surface less than that of the aforementioned side and which is an electroconductive layer or which is intended to be covered with an electroconductive layer. These sheets are particularly suitable, but not exclusively, to be used in applications in electronics, such as for example in printed electronics.

It has already been proposed to produce a sheet for printed electronics using a method comprising the steps consisting of preparing a multi-layer structure comprising a plastic film, a printable layer, and an anti-adhesive layer inserted between the plastic film and the printable layer, of cross-laminating the multi-layer structure and the substrate, removing the plastic film from the printable layer, then printing this printable layer with an ink having electrical properties.

However, after it is produced, this sheet is not necessarily electrically conductive as, although it is printed with an ink comprising electroconductive particles, these particles are not interconnected to each other in such a way as to form a continuous electroconductive layer.

Printed electronics consists of depositing an electroconductive layer on a supple and flexible support, such as a plastic film, for the purpose of producing electronic components such as electronic chips, of the RFID type for example.

However, although plastic films (such as those made of PEN and from PET) have a low surface roughness which is particularly interesting for printed electronics, these plastic films are not very stable thermally and are relatively expensive (the cost of these films being greater than or equal to approximately 4 euros/m$^2$).

The invention has in particular for purpose to provide a simple, effective and economical solution to the problems and needs of prior art and has for purpose a method for producing a sheet, in particular with a paper base, and comprising an electroconductive layer.

Contrary to plastic films, papers and sheets with a paper base are more economical and furthermore have the advantage of being able to be recycled and of being more stable thermally. Furthermore, the use of sheets or papers for printed electronics allows for the realisation of very large printed surfaces, which are more difficult to obtain using plastic films. Moreover, a sheet or a paper can be printed for an application in electronics directly after it is produced, i.e. the printing machine can be arranged directly after the machine for producing the paper, according to a continuous process (roll-to-roll process). In addition, it is easier to obtain a white and glossy paper than a white and glossy plastic film because the combination of the gloss and whiteness properties are difficult to obtain with a plastic film, which is furthermore more difficult to cover with a coating composition in an aqueous medium than a paper which has a hydrophilic nature.

The invention proposes for this purpose a method for producing a sheet comprising at least one electroconductive layer, this sheet comprising a substrate, in particular made of paper, of which at least one side is covered at least partially with a layer or with several superimposed layers of which the aforementioned electroconductive layer, the method comprising the steps of:

a/ preparing or providing a multi-layer structure comprising at least, or comprised of, a plastic film, an anti-adhesive coating, and a base layer, with the anti-adhesive coating inserted between a side of the plastic film and the base layer, b/ gluing a side of the substrate and/or the side of the multi-layer structure located on the opposite side to the plastic film, and applying the aforementioned side of the substrate against the aforementioned side of the multi-layer structure, in such a way as to cross-laminate the multi-layer structure and the substrate, c/ removing the plastic film and the anti-adhesive coating from the base layer, characterised in that the base layer is a layer of an electroconductive material or is covered with an electroconductive layer by an additional step consisting of:

d1/ depositing an electroconductive film on the base layer; or d2/ printing the base layer with at least one ink having electrical properties, with the base layer being a printable layer with a binder base of which the rate is 15% greater in dry weight in relation to the total dry matter weight of this layer, then possibly subjecting the printed sheet to an annealing heat treatment in such a way as to form a layer of electroconductive ink.

The base layer can be an optical and/or opto-electronic layer forming for example a wave guide.

In this application, sheet and substrate intended for the preparation of the sheet mean a thin element (of which the thickness does not exceed 1 mm, and for example 0.5 mm), more preferably supple and/or flexible.

The method according to the invention defines at least three separate alternative embodiments according to the nature of the base layer of the sheet, in order to prepare a sheet comprising the desired properties.

The base layer can include an electroconductive material or be carried out in an electroconductive material and can therefore itself define an electroconductive layer. The base layer can for example be formed of a metal layer.

Alternatively, the base layer can be intended to be covered with an electroconductive layer, and as such be covered with an electroconductive layer which is either an electroconductive film or a layer of electroconductive ink. In this latter case, the base layer is a printable layer which is printed with an ink having electrical properties and which is then possibly subjected to a step of annealing in such a way as to form a continuous layer of electroconductive ink on the base layer. An ink having electrical properties is an ink comprising conductive elements such as nanoparticles and/or molecules, with these elements conferring to a sheet printed with the ink (and possibly subjected to a step of annealing) an electrical conductivity.

The inventors observed that this latter embodiment made it possible to produce a sheet with good electrical conductivity. In a particular embodiment of the invention, the method makes it possible to obtain a sheet of which the electroconductive layer has a resistance per square less than 0.3 Ω/sq, more preferably less than 0.15 Ω/sq, and for example to a resistance of approximately 0.05 Ω/sq, i.e. a sheet which has good electrical conductivity. This parameter can be determined by a device called a "4-tip device". The method for determining this parameter shall be described in more detail in what follows.

The three aforementioned embodiments of the invention have in particular in common the producing of an electroconductive sheet, i.e. a sheet having an electrical conductivity that is sufficient for the purposes for example of being used in electronics.

In these embodiments, the electroconductive layer can be subjected to an additional step of laser ablation for the carrying out of an electric circuit or other on the sheet, according to particular patterns.

The method according to the invention makes it possible to carry out a sheet having an electroconductive layer with a smooth base layer (or slightly rough) and glossy. The smoothness obtained is greater than that of a sheet or of a paper produced via a conventional method, and is sufficient for the sheet to be used in the field of electronics. The roughness (AFM) of the sheet obtained by the method according to the invention is for example of approximately 10 nm.

In addition, when this base layer is printable, it can be observed that, after printing, the optical density of the inks remains relatively constant over time. The more the optical density of the inks on the sheet increases/varies, the more the inks penetrate deeply into the sheet and the less these inks remain therefore on the surface of the sheet, which means that the printed surface of the sheet is relatively porous (or "open") in opposition to a non-porous (or "closed") surface of a sheet whereon the inks remain on the surface.

In the case with printed electronics, when the base layer is intended to be printed with an ink having electrical properties, it is important that the base layer be the least porous possible (i.e. as closed as possible) as the fraction of the inks that penetrates into the pores of the sheet do not participate in the conduction. For this, within the framework of the invention, the printable base layer comprises a binder rate which is 15% greater in dry weight in relation to the total dry matter weight of this layer. The binder rate can be 20% greater in dry weight in relation to the total dry matter weight of this layer. It is for example between 15 and 100% and more preferably between 20 and 100% in dry weight in relation to the total dry matter weight of this layer. It can be between 15 and 50% (or between 20 and 50%), more preferably between 15 and 40% (or between 20 and 40%), and most preferably between 15 and 30% (or between 20 and 30%), in dry weight in relation to the total dry matter weight of this layer. In the case where the base layer comprises 100% in dry weight in relation to the total dry matter weight of this layer, this layer does not comprise any pigments.

Several types of application for printed electronics exist, of which six primarily stand out:
- printed circuits comprising conductive tracks, resistors, capacitors and transistors;
- photovoltaic cells;
- screens (electrochromic or LCD);
- membrane keyboards; the sheet can then include a component or be subjected to a particular treatment in order to render it fire-retardant, the sheet can for example include flame retardants of the aluminium trihydroxide type, for example BACO FRF40® from the Alcan Chemicals company (values of 30% of BACO FRF40® in the mass of the sheet can make it possible to obtain a M1 or M2 fire classification); size press products can also be added, of the phosphorus/ammonium salts type with rates of 50% in relation to starch; other products can also be used, for example with an of ammonium polyphosphate, antimony trioxide, ammonium sulphamate, etc. base;
- OLEDs (organic light-emitting diodes) are light-emitting diodes of which the emitting material is an organic material; when a current passes through this material, it becomes a source of light;
- "Switch" membranes make it possible to make a momentary connection via contact; conductive ink is deposited on a flexible support of the polyester or polycarbonate type; a dome is formed and constitutes the active element of a button; under the effect of a pressure, the dome is deformed and closes the circuit; this technology is used in mobile telephones, cameras, control panels, toys, etc.; and
- RFID (Radio Frequency IDentification) labels, also called smart labels or chip, tag or transponder labels are pieces of equipment intended to receive a radio signal and to send a different radio signal back as a response, containing information.

Those skilled in the art, specialised in printed electronics, are able to determine the different layers of the sheet or of the aforementioned multi-layer structure, which are required to carry out electronic components of the aforementioned type, as well as the respective arrangements of these layers in the sheet obtained by the method according to the invention. These different layers can be deposited onto the sheet according to the invention by the same techniques as those used in prior art for the depositing of similar layers onto plastic films for printed electronics.

The information hereinbelow substantially relates to the steps a) to c) of the method according to the invention.

The multi-layer structure of the sheet can be prepared prior to implementing the method of fabrication of the printable sheet. In this case, the multi-layer structure is added in order to carry out the method of fabrication of the sheet.

According to the invention, the base layer is prepared on a plastic film called "donor", with this base layer, at this stage, comprised in a multi-layer structure, then is transferred onto the substrate called "receiver". This technique makes it possible to transfer the smoothness of the plastic film to the base layer of which the smoothness therefore does not depend on that of the substrate used. The invention therefore makes it possible to transfer the surface finish of a plastic film onto any substrate. In other words, the invention makes it possible to produce a relatively smooth sheet using any substrate, such as advantageously a rough paper and/or a paper having a relatively high bulk, for example greater than or equal to 0.9 $cm^3/g$, even 1.10 $cm^3/g$, and without including a plastic film in the sheet produced as such. The substrate can also be a tracing paper, a traditional paper, a lightweight paper, a coated paper, a card stock paper, a pre-coated paper, a sheet or a plastic film, a glass slide or sheet, a sheet of metal such as sheet metal, a wooden slat, a fabric, etc.

In this application, sheet and substrate intended for the preparation of the sheet mean a thin element (of which the thickness does not exceed 500 μm), more preferably supple and/or flexible.

A multi-layer structure of the invention prepared or added in the framework of the method according to the invention comprises in particular, or is constituted by, a lower plastic film, an anti-adhesive intermediary coating and an upper base layer. The anti-adhesive coating covers at least one portion of the upper side of the plastic film, and the base layer covers at least one portion of the upper side of the anti-adhesive coating.

The plastic film is used as a support for producing the base layer. This film does not remain in the final product, i.e. the sheet, which can therefore be recycled. The upper side of the film (located on the side of the base layer) is advantageously as smooth as possible, as the surface quality of the smooth side of the sheet, defined by the base layer, is according to the surface quality of this upper side of plastic film. In other words, the smoother the plastic film of the multi-layer structure is, the smoother the sheet obtained is.

The plastic film is chosen from among a film of polyethylene terephthalate (PET), of polyethylene (PE), of polypropylene (PP), of polylactic acid-base polymer (PLA), of any polymer with a cellulose base, etc. The film for example has a thickness of approximately 12 µm.

The side of the film located on the side of the base layer is more preferably smooth and can have a Bekk smoothness greater than 10,000 s Bekk.

The thickness, the hardness and the glass transition temperature of the plastic film have little or no influence on the characteristics of the base layer. Only the smoothness, or on the contrary, the roughness of the plastic film has an influence on the smoothness or the roughness of the base layer. The smoother the plastic film is, the smoother the base layer is. Those skilled in the art are however able to determine which characteristics of the plastic film are able to influence the surface finish of the base layer, and to optimise these characteristics according to the final smoothness that is sought for this base layer.

The anti-adhesive coating of the multi-layer structure is deposited onto the plastic film by any technique, and for example by rotogravure. This anti-adhesive coating has for function to limit the adherence of the base layer on the plastic film and to facilitate the separation and the removal of the plastic film from the base layer in step c/ of the method defined hereinabove. The anti-adhesive coating does not or hardly modifies the smoothness and the surface quality of the side of the plastic film, whereon this layer is deposited.

The anti-adhesive coating adheres more preferably more onto the plastic film than on the base layer, in such a way that the entire amount of the coating remains glued onto the plastic film, when it is removed from the base layer.

The anti-adhesive coating has a thickness less than or equal to 5 µm and more preferably 1 µm. Its thickness is more preferably greater than 0.1 or 0.2 µm. The anti-adhesive coating can be composed of silicone(s), siloxane(s), polysiloxane(s) or of its derivatives, Werner compound(s), such as chromium stearo chloride, or of polyethylene waxes, of propylene, of polyurethane, of polyamide, polytetrafluoroethylene, of an acrylic polymer, etc. Advantageously, the anti-adhesive coating does not contain any PVDF.

As indicated hereinabove, according to the embodiment of the invention, the base layer can be electroconductive or not and can be printable or not.

Preferably, the base layer is free of anti-blocking agents and/or of a product able to decrease the surface energy of the layer, such as a silicone or analogous material, PVDF, PP, Teflon, silica, boron nitride, etc. This type of agent or product can be necessary for a printing a layer by heat transfer, in particular in order to prevent the substrate from adhering to the ribbon of the printer. The base layer according to the invention can therefore not be printable by heat transfer.

The base layer can have a thickness less than or equal to 30 µm, more preferably less than or equal to 15 µm, and more preferably less than or equal to 10 µm. Its paper weight is advantageously less than or equal to 30 g/m², more preferably less than or equal to 15 g/m², and most preferably less than or equal to 10 g/m². The base layer can for example have a thickness and a paper weight which are less than or equal to the following combined values: 10 µm and 10 g/m², 3 µm and 10 g/m², 2 µm and 10 g/m2, 5 µm and 5 g/m², 3 µm and 5 g/m², 2 µm and 5 g/m², 5 µm and 2 g/m², 3 µm and 2 g/m², or 2 µm and 2 g/m².

The base layer can be deposited onto the anti-adhesive coating by any technique, and for example by rotogravure.

The base layer can be deposited onto the anti-adhesive coating in the liquid or semi-liquid state then be solidified by drying, heating, or by electronic or UV radiation. After solidification and/or drying, the base layer, which is in contact with the smooth side of the plastic film by the intermediary of the anti-adhesive coating, has a smooth side, located on the side of the plastic film.

The base layer is therefore dried and/or solidified before it is transferred onto the substrate, in particular in order to not modify the surface finish of this layer conferred by the plastic film. In other words, the multi-layer structure is prepared prior to the transfer of the base layer onto the substrate, and the base layer is in the solid and/or dry state during its transfer onto the substrate, i.e. in the steps b/ and c/ of the method according to the invention. The surface finish of the base layer is therefore created during the preparation of the multi-layer structure.

In the method according to the invention, the production of the base layer is therefore carried out independently of that of the base substrate. This makes it possible in particular to implement the method with standard industrial tools, which allows for optimal production speeds.

The base layer of the sheet can have a Bekk smoothness greater than 900 or 1000 s approximately, more preferably greater than 2000 s, and most preferably greater than 5000 s.

This base layer can have a gloss greater than 70%, and more preferably greater than 80%, this gloss being for example measured at 75 according to the TAPPI® T480 om-92 method. This gloss can be similar and even greater than that of a photographic paper of the resin-coated type, comprising a plastic film.

The multi-layer structure can include at least one additional layer deposited onto the base layer, on the opposite side of the plastic film, the free side of this additional layer or of the additional layer the farthest away from the plastic film being intended, in step b/, to be glued and applied against the aforementioned side of the substrate.

The additional layer or layers can be functional or non-functional. They can for example be insulating (dielectric) or form a barrier (to gases, for example to oxygen, to liquids, for example to water, to greases, etc.).

The sheet can include a metal film and/or a barrier layer with a base of polyurethane (PU), of polyvinyl alcohol (PVA), of polyvinylidene chloride (PVDC), of vinyl acetate ethylene copolymer (EVAC), of cellulose nanofibres, or of metal, this barrier layer being located between the substrate and the base layer. A layer with a PVA base is particularly suited for forming a barrier against gases and a layer with a PU base is particularly suited to form a water vapour barrier.

The electroconductive layer can act as a barrier layer, this electroconductive layer forming the external layer of the sheet or on the contrary being sandwiched between two layers of the sheet. The electroconductive layer can be a metal layer vacuum deposited or a metal film (such as aluminium for example), which can be added and fixed via cross-lamination.

The or each additional layer can be a layer of a semiconductor material (P3HT—poly(3-hexylthiophene), etc.) N-dopes, P-doped or not doped, a layer of a dielectric material (PVP, etc.), a metal layer (gold, silver, aluminium, etc.), a layer of electroconductive polymer (PEDOT:PSS—poly(3,4-ethylenedioxithiophene: poly(styrene sulphonate), etc.).

In the case where the multi-layer structure comprises a single additional layer, the latter can be deposited either onto the upper side of the base layer, i.e. onto the side of the base layer, located on the opposite side of the plastic film of the multi-layer structure, or under the base layer.

This additional layer can be of any nature. In the case where the multi-layer structure comprises two or several additional layers, these additional layers are superimposed over each other and deposited onto the aforementioned upper side of the base layer. The technique or techniques used to deposit the additional layer or layers onto the base layer can be of the aforementioned types, or of any other type.

The multi-layer structure can therefore include in addition to the three aforementioned elements (a plastic film, an anti-adhesive coating, and a base layer), one or several additional layers on the base layer. The multi-layer structure can furthermore include a layer or a film of adhesive covering the layer the farthest away from the plastic film (i.e. the base layer or the or an additional layer).

The step b/ of the method according to the invention consists of gluing the side of substrate intended to receive the base layer, or the side of the multi-layer structure, located on the opposite side to the plastic film, and in applying these sides against one another, in such a way as to affix them.

The substrate can be chosen from among a paper, a tracing paper, a card stock paper, a coated or pre-coated paper, a sheet or a plastic film, a glass slide or sheet, a sheet of metal such as sheet metal, a thin wooden slat, a fabric, etc. The paper can have a relatively substantial bulk greater than or equal to 0.9 $cm^3/g$, even 1.1 $cm^3/g$, more preferably greater than or equal to 1.2 $cm^3/g$, most preferably greater than or equal to 1.3 $cm^3/g$, more particularly greater than or equal to 1.4 $cm^3/g$, and further more greater than or equal to 1.5 $cm^3/g$.

The method according to the invention can make it possible to carry out a sheet having both a substantial bulk and smoothness, which was not possible with prior art. Indeed, it was not possible in prior art to carry out a sheet with a substantial bulk and a high surface quality. A substrate having a substantial bulk can be formed from an inexpensive material. In the case of a paper, the wood pulp used can include cellulosic fibres, a binder, and a low proportion of fillers and/or adjuvants, such as starch.

In a particular embodiment of the invention, the method according to the invention results in a slight decrease, by 2 to 5% approximately, in the bulk of the substrate paper.

During the step b/ of the method, the side to be coated of the substrate or the free side of the base layer or of an additional layer of the multi-layer structure, is glued by means of a suitable adhesive.

Alternatively, the two aforementioned sides of the substrate and of the multi-layer structure are glued simultaneously, or one after the other. Advantageously, only the free side of the base layer or of an additional layer of the multi-layer structure is glued.

Adhesion consists of depositing a layer of adhesive on the aforementioned side or sides, via any technique, such as for example by rotogravure. The adhesive can be of the thermal type, non thermal, by UV cross-linking or by chemical reaction. The adhesive can be deposited onto the or onto each aforementioned side in liquid or non-liquid form (in the case for example of a thermo-adhesive film). This adhesive is for example chosen from among the following polymers: acrylic, polyurethane, polymethylmethacrylate, styrene butadiene, vinyl acetate, polyamide, nitrocellulose or any other cellulose, polyvinyl alcohol or starch. The or each layer of adhesive deposited can have a thickness less than or equal to 10 µm, and more preferably less than or equal to 3 µm. The adhesive is advantageously a single-component or two-component polyurethane adhesive, with or without solvent.

In a particular embodiment of the invention, the adhesive is deposited on the aforementioned side of the multi-layer structure during the preparation of this structure. This adhesive then is integrally a part of the multi-layer structure. The adhesive can be formed by a heat activatable adhesive layer, this layer being activated by heating during the application of the multi-layer structure onto the substrate (receiver).

The nature of the adhesive and the adhesive process (on the film and/or on the substrate/paper) can have a substantial influence on the final surface finish of the sheet. It is for example important that the depositing of the adhesive be uniform and to prevent the formation of cavities between the substrate and the base layer.

With regards to the uniformity of the depositing of the adhesive, the depositing of the adhesive is more preferably homogeneous in order to prevent excess and/or lack of adhesive in locations, which would result in a final sheet having surface roughnesses. Advantageously, the adhesive spreads perfectly over the support (film or substrate) having a suitable surface tension and rheology.

The coating method of the adhesive can also have an importance. Coating methods that generate the least amount of heterogeneity in the deposit, such as rotogravure (reverse roll or kiss coating) are preferred. The depositing is more preferably chosen in order to fill to the maximum the pores or surface irregularities of the substrate. By way of example, when a paper has an average surface roughness (for example Sa) of approximately 20 µm, a depositing of adhesive having a thickness of at least 10 µm is preferred in order to fill in the pores. The depositing of adhesive is more preferably carried out on the substrate when the latter is too rough. If the depositing on a paper is insufficient, cavities are then formed between the surface of the paper and the base layer. During printing, these cavities will becomes weak points for the paper which could then either sink, if a pressure is exerted, or be pulled off, if a traction is exerted.

Advantageously, the thickness of adhesive deposited onto the substrate and/or the base layer is equal to at least half of the average surface roughness (for example Ra or Sa) of the substrate. In an embodiment of the invention, the adhesive is deposited on at least one side of the substrate in step b/, and the thickness of the layer of adhesive deposited is at least equal to half of the average roughness of the side of the substrate, and is more preferably equal to this average roughness.

The adhesive can be with a water base, solvent, without solvent, two-component or single-component.

The adhesive makes it possible to fix the base layer (or an additional layer) onto the substrate and, where applicable, to compensate the surface irregularities of the substrate. The adhesive in particular fills in the hollows of the side to be coated of the substrate and thus makes it possible to flatten this side, without however modifying the characteristics of the substrate, such as its bulk.

The substrate of the sheet can include fillers intended to increase the thermal diffusivity of the sheet and/or to increase the wet strength of the sheet and/or to render the sheet fire-retardant, as shall be explained in more detail in what follows.

The step b/ of the method then consists of applying the aforementioned side of the substrate onto the aforementioned side of the multi-layer structure, in such a way as to laminate them or cross-laminate them. The base layer is then sandwiched between on the one hand the substrate and the adhesive (and where applicable one or several additional layers), on one side, and on the other hand the plastic film and the anti-adhesive coating, on the other side.

In the case where the adhesive used for gluing the substrate onto the multi-layer structure is of the thermo-adhesive type, the application of the substrate onto the multi-layer structure is carried out hot, at a given temperature, which is for example between 50 and 200° C. approximately. Alternatively, the application and the gluing of the substrate onto the multi-layer structure can be carried out at ambient temperature.

A pressure can be necessary in order to provide good adhesion of the base layer on the substrate, by the intermediary of the adhesive.

The temperature and/or the pressure used during the application and the gluing must not however modify the characteristics of the base layer, and in particular the surface finish of its side located on the side of the plastic film. For example, the base layer must not be softened by the application of a high temperature, because this could result in a modification and/or a decrease in the surface quality of its side, located on the side of the plastic film.

The step c/ of the method then consists of removing the plastic film from the base layer and from the substrate, in such a way that the base layer (and where applicable the aforementioned additional layer or layers of the multi-layer structure) remain on the substrate. The base layer, and where applicable the additional layer or layers, are therefore transferred from the plastic film called donor, of the multi-layer structure, onto the substrate called receiver.

The method can further include a step of cross-linking or maturing of the adhesive before removing the film.

As explained hereinabove, the entire amount of the anti-adhesive coating remains more preferably on the plastic film and is then removed from the base layer, during the removal of the plastic film. The side of the base layer, which was located on the side of the plastic film in the multi-layer structure, is therefore exposed.

The transfer of the base layer of the multi-layer structure onto the substrate, in the steps b/ and c/ of the method, can be carried out in the following manner, when the substrate and the multi-layer structure have the form of continuous strips.

The laminating or cross-laminating of the multi-layer structure and of the substrate can be carried out by passing these two elements between two adjacent and parallel mechanical rollers, rotating in opposite directions. The thickness of the product obtained is in particular according to the distance between the rollers. Once the adhesive is dry or solidified, the plastic film is removed from the sheet while the latter is driven by another mechanical roller.

Alternatively, either the multi-layer structure or the substrate can be glued, dry the adhesive, then place these two elements in contact with each other by applying a determined temperature and pressure.

The method can further consist in that, before the step b/, the aforementioned side of the substrate is pre-coated with at least one smoothing layer comprising one or several thermoplastic polymers (such as at least one polystyrene, a polyurethane, an acrylic, etc.) or a mixture of pigments (such as kaolins, calcium carbonates, talc, titanium dioxide, etc., and their mixtures) and of at least one binder (such as with an acrylic base, polyurethane, polymethylmethacrylate, styrene butadiene, vinyl acetate, polyamide, nitrocellulose or of any other cellulose, starch or PVA).

This pre-coated side of the substrate can furthermore be calendared, before the step b/, in order to increase its smoothness.

With regards to the step d1/ of depositing the electroconductive film, this film can be formed of metal or of conductive polymer or any other electroconductive material. It can be produced independently of the sheet then be added and affixed, for example by gluing, onto the base layer of the sheet. Alternatively, it is formed in situ on the base layer of the sheet.

The information hereinbelow relates to the step d2/, according to which the base layer is printable.

A printable layer is a layer that can be printed by any printing technique, and in particular by Offset, ink jet, laser, heliography, flexography, screen printing, dry toner, liquid toner, electrophotography, lithography, etc. printing. A printable layer comprises a binder and can further include pigments.

According to a characteristic of the invention, the printing of the base layer does not result in any structural modification of the latter, and in particular any change in the state or phase of the latter (such as for example a passing from a solid state to a liquid state and then returning to the solid state).

When the base layer of the multi-layer structure is a printable layer, it can be chosen from among a printable varnish, a paper coating, etc.

In this application, printable varnish means a substance with a base of acrylic polymer, polyurethane, polymethylmethacrylate, styrene butadiene, vinyl acetate, polyamide, nitrocellulose or of any other cellulose, polyvinyl alcohol, starch, etc. This substance is in general deposited in the liquid form and solidified by drying/heating or by UV radiation or electronics.

Paper coating or coating composition means a composition comprising a binder and possibly pigments. The binder of the printable base layer can include a main binder and possibly a co-binder.

In this application, main binder means a binder which is the majority in the layer in relation to the other binders, in particular in relation to the co-binder(s).

The main binder is advantageously a synthetic latex such as a styrene-butadiene copolymer (XSB) and/or a styrene-acrylate copolymer (SA). The binder can include a combination of two latexes, such as XSB and SA, in proportions between 55 and 80% for XSB and between 20 and 45% for SA (in dry weight in relation to the total dry weight of these binders), even between 60 and 70% for XSB and between 30 and 40% for SA (in dry weight in relation to the total dry weight of these binders). The base layer can include a binder with an acrylic base, polyurethane, polymethylmethacrylate, styrene butadiene, vinyl acetate, polyamide, nitrocellulose or of any other cellulose, polyvinyl alcohol, starch, or a mixture of the latter.

The co-binder is more preferably an adhesion promoter with an ethylene copolymer—acrylic acid (EAA) base. This co-binder can make it possible to increase the gloss of the base layer and to improve the adhesion phenomenon of certain inks on the base layer, such as liquid toner inks of the HP indigo type.

The pigments can be the majority in relation to the binder in a paper coating. The pigments have for example an average size or an average diameter less than or equal to 2 µm environ, even 1 µm, and for example of approximately 0.5 µm. The pigments can be chosen from among the calcium carbonates, kaolins, titanium dioxide, talc, silicas, mica, and pearlescent particles, plastic pigments (polystyrene (PS), polyurethane (PU), styrene-acrylic, etc.—such as the Ropaque Ultra-E pigment from the Rohm&Haas company), metal pigments (silver, copper, or, etc.—such as the Brookprint Sparkle Silver pigment from the Rondot S.A. company), and their mixtures. These are advantageously calcium carbonates.

The plastic material used in the base layer (as a binder and/or pigments) is easily fragmented and does not pollute the wood pulp when it is recycled. On the contrary, the plastic films retain a cohesion and clog the filters during the putting back into suspension of the wood pulp. The water-soluble binders (such as starch, polyvinyl alcohol (PVA), etc.) are particularly advantageous for this subject as they are dispersed in the water during recycling.

The paper coating can further include a dispersant and/or a rheology modifier and/or a colouring agent and/or a surfactant or spreading agent and/or a conductive additive. This conductive additive can be used to decrease the surface resistivity of the sheet.

The printable base layer can be formed of two or more underlayers superimposed on one another, with each underlayer being printable and being chosen from among the aforementioned types (printable varnish, paper coating, etc.).

Advantageously, in the case where the paper forming the substrate of the sheet is a tracing paper, the printable base layer has a transparency and a binder rate greater than 30% in dry weight in relation to the total dry matter weight of the layer, in such a way that the sheet obtained par the method has a certain transparency. The use of a tracing paper is particularly advantageous in order to authorise the passage and the recovery of radiation energy through the sheet, and is therefore particularly suited for the carrying out of photovoltaic or solar cells. The transparency of a tracing paper depends in particular on its paper weight and is for example of approximately 60-70% for a tracing paper of 62 g/m² and 40-50% for a tracing paper of 175 g/m2.

The ink can for example include nanoparticles or metal microparticles (silver, copper, or, etc.), nanoparticles or microparticles of carbon, and/or at least one conductive polymer (such as PEDOT/PSS).

The metal particles can be in the form of a powder. There are therefore spaces between them when they are deposited onto the base layer. The step of annealing makes it possible to coalesce or to sinter the nanoparticles together and as such authorise the passing of current between the latter. The conductive layer deposited has for example a thickness less than or equal to 1 µm, which can be less than or equal to 300 nm, and which is for example of approximately 30 nm. This relatively low thickness makes it possible however to confer good conductivity to the sheet. Indeed, due to the substantial smoothness of the base layer, it is not required to deposit a thick conductive layer onto the base layer because the thin layer of ink remains continuous on the surface. It can be considered to deposit a layer of gold with a thickness between 20 and 100 nm, and for example between 30 and 40 nm environ.

The annealing can be carried out in an oven (for example, at a temperature between 150 and 200° C. and for 5 to 10 min approximately), on a hot plate, in a photon oven or in an infrared dryer. The photon oven (for example the Pulse-Forge® 3300 device from the NovaCentrix company) makes it possible to carry out an effective sintering of the conductive particles of the inks, which are more preferably deposited onto the base layer by screen printing. The conductive particles can be particles of silver, copper, various alloys, etc. This is for example carried out at a temperature greater than or equal to 100° C., more preferably greater than or equal to 120° C., and most preferably greater than or equal to 150° C., which is highly advantageous as this makes it possible to obtain a good cohesion of the electroconductive materials or particles of the inks and therefore provide a better electrical conductivity for the layer, with the sheet having an excellent thermal stability at 150-170° C. The plastic films (PET, PEN, etc.) from prior art cannot be subjected to such annealing temperatures because they break down in general starting at 120-140° C. The annealing time can be less than or equal to 5 minutes and is for example between 2 and 3 minutes. The annealing can be carried out by maintaining the sheet in traction (along an axis or two perpendicular axes, for example) in such a way as to limit the variations of the dimensions of the sheet during annealing. Generally, the sheet has good thermal and dimensional stabilities during annealings or during any such treatments.

The method according to the invention can further include one or several of the following steps:
- before the step d2/, a step of heat pre-treatment of the sheet in order to remove at least one portion of the water that it contains; a paper can include approximately 5% in water weight; the heat pre-treatment makes it possible to remove the water from the sheet in such a way that the sheet printed and subjected to annealing substantially no longer contains any water; this makes it possible to limit the risks of rippling and of deformation of the sheet during annealing due to the evaporation of the water contained in the paper of this sheet;
- removing via photolithography or via laser ablation certain predetermined zones of the electroconductive layer of the sheet;
- repeating at least once the step d2/, with each step d2/ which follows a step d2/ being separated from this step by an intermediary step of rest of the sheet, during which the sheet is intended to substantially recover its initial humidity rate; and
- carrying out, before the step d2/, a step consisting of subjecting the base layer to a plasma treatment; this treatment makes it possible to modify the surface finish of the base layer and to render it more hydrophobic, which makes it possible to prevent the ink from spreading out and wetting the base layer too much (and resulting in an increased precision and resolution in the patterns printed on the layer); advantageously, the base layer is subjected to a fluoride plasma treatment ($SF_6$).

The method can further include a step consisting of carrying out with the sheet at least one resistor, a capacitor, a transistor, an RFID chip, an antenna, a logic circuit, a membrane switch (SWITCH), a photovoltaic cell, a battery, a means for collecting energy, a backlighting system, a means of solid-state lighting or display such as an organic or inorganic light-emitting diode (OLED), a sensor, a membrane keyboard, or any combination of these components.

The method can furthermore be characterised in that:
(i) in the multi-layer structure prepared in step a), the base layer extends on a surface less than that of the aforementioned side of the plastic film, and/or (ii) the multi-layer structure and the substrate are cross-laminated in step b) on a surface less than that of the aforementioned side of the sheet, and/or
(iii) the plastic film removed in step c) has at least one dimension among its length and its width which is less than the corresponding dimension or dimensions of the aforementioned side of the sheet, and/or
(iv) the sheet obtained in step c) is cut then at least one cut piece of this sheet is glued onto the substrate of another sheet, in such a way that the sheet comprises at least one side having at least one zone of greater smoothness than the rest of this side, this zone comprising a smooth external layer which is formed by the base layer and which extends over the substrate of the sheet on a surface less than that of said side.

The method can include, between the steps a) and b), a step of cutting of the multi-layer structure.

Preferably, at least one cut piece of the multi-layer structure is cross-laminated to the substrate in step b), and the plastic film and the anti-adhesive coating are removed from the glued piece, in step c), the cut piece being for example in the form of a strip having a length of several meters.

Preferably, the application of the multi-layer structure on the substrate is realised in step b) by means of a stamp press which is intended to apply a pressure in the aforementioned zone, or by means of a hot foil stamp press which makes it possible to soften the adhesive used in step b), which is of the heat-sensitive type.

Preferably, the plastic film of the multi-layer structure prepared in step a) has at least one dimension among its length and its width which is less than the corresponding dimension or dimensions of the aforementioned side of the sheet.

Preferably, the sheet is carried out on line in a paper machine, for example in a final section of drying of this paper machine, or off line in a paper cutting or finishing machine.

The method can include, before the step c), a step of printing the side of the multi-layer structure located on the opposite side of the plastic film with electroconductive inks, or of depositing an electroconductive coating onto this side.

Preferably, during the step a), the anti-adhesive coating deposited onto the plastic film is printed with electroconductive inks or is covered with an electroconductive coating.

Advantageously, in the aforementioned case (iv), the sheet to be cut or the cut piece is printed with electroconductive inks or is covered with an electroconductive coating, before the gluing onto the substrate of the other sheet.

The invention further relates to a method for producing an electroconductive product comprising the carrying out, by means of a sheet, more preferably, obtained by a method such as described hereinabove, of at least one resistor, a capacitor, a transistor, an RFID chip, an antenna, a logic circuit, a membrane switch (SWITCH), a photovoltaic cell, a battery, a means for collecting energy, a backlighting system, a means of solid-state lighting or display such as an organic or inorganic light-emitting diode (OLED), a sensor, a membrane keyboard, or any combination of these components, in particular by implementing a step of printing of the base layer and/or a step of removing via photolithography or via laser ablation of certain predetermined zones of the electroconductive layer.

The invention further relates to an electroconductive product, characterised in that it comprises a sheet, more preferably, such as obtained by a method such as described hereinabove, said sheet being converted into a product comprising at least one resistor, a capacitor, a transistor, an RFID chip, an antenna, a logic circuit, a membrane switch (SWITCH), a photovoltaic cell, a battery, a means for collecting energy, a backlighting system, a means of solid-state lighting or display such as an organic or inorganic light-emitting diode (OLED), a sensor, a membrane keyboard, or any combination of these components, in particular by implementing a step of printing of the base layer and/or of a step of removing via photolithography or via laser ablation of certain predetermined zones of the electroconductive layer.

In the aforementioned case, the treated side of each sheet is entirely coated with the multi-layer structure of which the plastic film is intended to be removed. Substantial quantities of plastic film, of anti-adhesive coating and of adhesive can therefore be used, which increases the cost of the final product.

Due to the increase in this cost, the method can be reserved for specific applications and may not be able to be used in other applications.

Moreover, the step of laminating a paper requires, due in particular to the dimensions of the multi-layer structure, a particular machine which is intended to treat the paper after it is produced by a paper machine, i.e. off line.

Another aspect of the invention has in particular for purpose to provide a simple, effective and economical solution to this problem.

It proposes for this purpose a method for producing a sheet of which at least one side comprises at least one zone of greater smoothness than the rest of the side, this zone comprising a smooth external layer which extends over a substrate of the sheet on a surface less than that of said side, the method comprising the steps of:

a/ preparing or providing a multi-layer structure comprising at least, or comprised of, a plastic film, an anti-adhesive coating, and a base layer, with the anti-adhesive coating inserted between a side of the plastic film and the base layer, b/ gluing a side of the substrate and/or the side of the multi-layer structure located on the opposite side to the plastic film, and applying the aforementioned side of the substrate against the aforementioned side of the multi-layer structure, in such a way as to cross-laminate the multi-layer structure and the substrate, c/ removing the plastic film and the anti-adhesive coating from the base layer, with the base layer defining said smooth external layer, characterised in that:

(i) in the multi-layer structure prepared in step a), the base layer extends on a surface less than that of the aforementioned side of the plastic film, and/or
(ii) the multi-layer structure and the substrate are cross-laminated in step b) on a surface less than that of the aforementioned side of the sheet,
(iii) the plastic film removed in step c) has at least one dimension among its length and its width which is less than the corresponding dimension or dimensions of the aforementioned side of the sheet and/or
(iv) the sheet obtained in step c) is cut then at least one cut piece of this sheet is glued onto the substrate of another sheet.

In this application, the zone (of a side) of the sheet means a portion only (of the side) of the sheet. The zone has for example at least one dimension among its length and its width which is less than the corresponding dimension or dimensions of the sheet. The zone can for example have the form of a strip and extend along one of the longitudinal edges of the sheet. The zone can have a surface representing less than 50%, more preferably less than 20%, and most preferably less than 10%, of the surface (of the side) of the sheet.

According to the invention, a portion only of the side of the substrate of the sheet is covered with the aforementioned smooth external layer. This is particularly advantageous as this makes it possible to use quantities of plastic film, anti-adhesive coating and/or adhesive that are less than those used in prior art and therefore make it possible to reduce the cost of producing the sheet and to consider multiples applications that were not able to be considered in prior art for economical reasons.

In a particular case of producing a paper, the extra cost linked to the application of the method to this paper is relatively low, which makes it possible to consider the use of the paper in several different applications.

The aforementioned external layer confers a relatively substantial smoothness to the zone, which is greater than that of the rest of the sheet i.e. than the portions of the sheet that do not comprise this layer. This smoothness is induced by that of the plastic film of the multi-layer structure, and therefore does not depend on that of the base substrate used. By way of example, the or each aforementioned zone can have a Bekk smoothness greater than 900 s (more preferably greater than 1000 s, and most preferably greater than 2000 s), with the rest of the sheet having a Bekk smoothness less than 900 s (more preferably less than 500 s, and most preferably less than 200 s).

Moreover, the base layer can have magnetic properties (in particular ferromagnetic in the case de carrying out self-inductance, coil and antenna) or other properties such as in particular a barrier property (the base layer can be associated with an aluminium film or have properties close to those of an aluminium film), a property that modifies its appearance (the base layer can be coloured, reflective, etc.), an opto-electronic or optical property (the base layer can form a wave guide), and/or a security function (the base layer can include a micro-print, a hologram, be iridescent, etc.).

The sheet according to the invention furthermore has a clear advantage in terms of recycling because the portions of the sheet that are not covered with a smooth base layer can be recycled conventionally. The smooth portions of the sheet can be delaminated or cut in order to be recycled independently from the rest of the sheet in order to recover any electroconductive materials that it contains.

The multi-layer structure can include more than one layer, i.e. it can include one or several other layers inserted between the anti-adhesive coating and the base layer. In the case of multi-layer structures, the advantage is that the smoothness of the first layer is transmitted to the following layer. This is all the more so interesting in that the thermal stability of the paper allows for a stable stack providing an optical and electrical quality of the system to be carried out over a large surface (as successive annealing temperature are high and therefore the losses of fillers are low over long distances due to the excellent conductivity).

In the case of transparent electroconductive layers (of the PEDOT:PSS type for example), the thermal annealing is the only way to have the conductivity (flash sintering cannot be used due to its transparency), yet this layer is generally one of the last to be applied to the substrate in the case of multi-layer systems. Our ultra-smooth paper therefore makes it possible to reduce the quantity of transparent conductive polymers to be applied.

In the aforementioned first case (i) of the method according to the invention, in the multi-layer structure prepared in step a), the base layer extends on a surface less than that of the aforementioned side of the plastic film. The base layer therefore covers only a portion of the plastic film. The anti-adhesive coating which is sandwiched between the base layer and the plastic film can cover the entire amount of the plastic film or a portion only de this film. Advantageously, the base layer substantially covers the entire amount of the anti-adhesive coating which covers only a portion of the plastic film. The base layer can have a shape and dimensions similar to those of the zone of greater smoothness to be formed on the sheet.

In the aforementioned second case (ii) of the method, the multi-layer structure and the substrate of the sheet are cross-laminated in step b) on a surface less than that of the sheet. The adhesive can be deposited onto a portion only of the multi-layer structure and/or on a portion only of the substrate of the sheet. The glued portion or portions can have a shape and dimensions that are similar to those of the zone of greater smoothness to be formed on the sheet.

The cases (i) and (ii) can be combined. In this case, the base layer extends on a surface less than that of the plastic film in the multi-layer structure prepared in step a), and the multi-layer structure and the substrate of the sheet are cross-laminated in step b) on a surface less than that of the sheet.

In the aforementioned case (iii) of the method, the plastic film removed in step c) has at least one dimension among its length and its width which is less than the corresponding dimension or dimensions of the aforementioned side of the sheet.

The cases (i) and (iii) can be combined. The base layer extends on a surface less than that of the plastic film in the multi-layer structure prepared in step a), and the plastic film removed in step c) is smaller than the sheet.

The cases (ii) and (iii) can be combined. The multi-layer structure and the substrate of the sheet are as such cross-laminated in step b) on a surface less than that of the sheet, and the plastic film removed in step c) is smaller than the sheet.

Finally, the cases (i), (ii) and (iii) can be combined. In this case, the base layer extends on a surface less than that of the plastic film in the multi-layer structure prepared in step a), the multi-layer structure and the substrate of the sheet are cross-laminated in step b) on a surface less than that of the sheet, and the plastic film removed in step c) is smaller than the sheet.

In the aforementioned case (iv) of the method, the sheet obtained in step c) is cut then at least one cut piece from this sheet is glued onto the substrate of another sheet. This particular case can also be combined with the other aforementioned cases.

In the case where the sheet comprises a substrate made of paper, the invention is particularly advantageous as it makes it possible on the one hand to provide this paper with a zone of greater smoothness in a predetermined location and on the other hand to retain the rest of the sheet for a presentation of information for example, and in particular for the printing of information if the paper is printable.

The invention can furthermore be used on any type of substrate. It can be used in graphic art, for letterhead, for envelopes, Post-it®, secure paper, etc.

The sheet according to the invention in addition has the advantage of being able to be carried out in line in a paper machine, for example in a final drying section of this paper machine, or off line in a paper cutting or finishing machine.

The method can include, between the steps a) and b), a step of cutting of the multi-layer structure. One or several cut pieces of the multi-layer structure can be glued to the substrate in step b), and the plastic film and the anti-adhesive coating can be removed from the or from each of these glued pieces, in step c).

The or each cut piece is for example in the form of a strip having a length of several meters. This piece of elongated shape can be wound onto a roller and unwound from the roller (up to speeds of several hundred meters per second), which is particularly advantageous in the paper industry. The multi-layer structure is sufficiently resistant, due in particular to the presence of the plastic film, to be subjected to these windings/unwindings.

The application of the multi-layer structure on the substrate can be carried out in step b) by means of a stamp press which is intended to apply a pressure in the or each aforementioned zone of the multi-layer structure, or of a hot foil stamp press intended to soften the adhesive used in step b), which is of the heat-sensitive type.

The plastic film of the multi-layer structure prepared in step a) has more preferably at least one dimension among its length and its width which is less than the corresponding dimension or dimensions of the aforementioned side of the sheet.

The method can include, before the step c), a step of printing the side of the multi-layer structure located on the opposite side of the plastic film with electroconductive inks, or of depositing an electroconductive coating onto this side. The multi-layer structure is as such rendered electroconductive before the transfer of the base layer onto the substrate of the sheet. The layer or the electroconductive coating is located on the side of the multi-layer structure located on the opposite side of the plastic film and can therefore be located on a side of the base layer. During the step c), this side is glued against the substrate of the sheet. In this case, the electroconductive layer (coating or inks) is protected by the base layer which extends above this electroconductive layer. The aforementioned printing or the depositing can be carried out before the cutting of the multi-layer structure described hereinabove.

During the step a), the anti-adhesive coating deposited onto the plastic film can be printed with electroconductive inks or be covered with an electroconductive coating. The base layer is then deposited directly onto the inks or the coating in step a).

In the aforementioned case (iv), the base layer is more preferably transferred onto a substrate or a thin sheet. The sheet to be cut or the cut piece can be printed with electroconductive inks or be covered with an electroconductive coating, before the gluing on the substrate of the other sheet.

The sheet or the substrate of the sheet can be coated with a anti-adherent coating or formed from a plastic film, and/or be cut before the transfer of the base layer.

The method according to the invention can further include a step of treating the sheet for the purposes of increasing its resistance to humidity. The sheet can be WS (wet strength) treated, for example by means of WS agents which prevent the degradation of the sheet in a wet state. It is known that a polyamidoamine-epichlorohydrin can confer WS properties to the sheet. For example, 1% Kymene® 617 (Hercules company) in the sheet makes it possible to have a resistance to traction of 15% in the wet state in relation to the dry state.

This invention also relates to a sheet that can be obtained by the method described hereinabove, of which at least one side comprises at least one zone of greater smoothness than the rest of the side, this zone comprising a smooth external layer which extends on a surface less than that of the side, said smooth external layer being electroconductive or coated with an electroconductive layer, the electroconductive layer defining at least one of the following elements or being connected to at least one of the following elements: a resistor, a capacitor, a transistor, an RFID chip, an antenna, a logic circuit, a membrane switch (SWITCH), a photovoltaic cell, a battery, a means for collecting energy, a backlighting system, a means of solid-state lighting or display such as an organic or inorganic light-emitting diode (OLED), a membrane keyboard, and a sensor. The two sides of the sheet can comprise at least one zone of this type. The sheet can include at least two zones of the aforementioned type, the electroconductive layers of these zones able to be connected together electrically, for example by des conductors contained in the sheet.

These electroconductive layers can have different electronic functions and/or properties.

The or each zone can have a surface representing less than 50%, more preferably less than 20%, and most preferably less than 10%, of the surface of the aforementioned side of the sheet.

The sheet comprises for example a substrate made of paper.

The or each electroconductive layer can include (or be coated with) several diodes of micrometric size, such as those described in application WO2012/031096.

This invention further relates to a sheet that can be obtained by the method described hereinabove, of which at least one side comprises at least one zone of greater smoothness than the rest of the side, this zone comprising a smooth external layer which extends on a surface less than that of the side, said smooth external layer being covered with an optical and/or opto-electronic layer forming for example a wave guide.

The zone can further comprise at least one electroconductive layer, which is more preferably covered with microdiodes intended to emit a light beam to the optical layer when they are powered with an electric current.

This invention further relates to a method for producing a sheet provided with an optical layer such as a wave guide, the method comprising the steps of:

a/ preparing or providing a multi-layer structure comprising at least, or comprised of, a plastic film, an anti-adhesive coating, and a base layer, with the anti-adhesive coating inserted between a side of the plastic film and the base layer, b/ gluing a side of the substrate and/or the side of the multi-layer structure located on the opposite side to the plastic film, and applying the aforementioned side of the substrate against the aforementioned side of the multi-layer structure, in such a way as to cross-laminate the multi-layer structure and the substrate, c/ removing the plastic film and the anti-adhesive coating from the base layer, characterised in that an optical layer is deposited on the base layer.

The optical layer can be deposited onto the base layer by any suitable technique and for example by coating. The optical layer comprises for example one or several polymers.

The invention is indeed particularly advantageous for producing a sheet comprising an optical layer such as a wave guide(s). The base layer can be used as a support for a layer of polymer for example intended to guide a wave, such as an electromagnetic or light wave. The wave transmitted in this layer can reflect off of the particularly smooth and flat interface between the base and polymer layers, and can as such be transmitted within the layer of polymer.

In this application, an optical layer means a layer having optical properties and in particular a layer capable of reflecting, absorbing and/or diffusing at least one portion of a ray to which it is exposed. The optical layer can for example form a wave guide and can be formed from one or several materials.

This embodiment can be combined with each or with all or a portion of the aforementioned characteristics, in particular those relating to the creation of only one zone of greater smoothness on the sheet and the application of an electroconductive layer on the sheet.

In a particular case, the sheet is of the aforementioned type and comprises an optical layer, the base layer of this sheet being an electroconductive layer or covered with an electroconductive layer. The zones where the optical and electroconductive layers extend can be independent or at least partially superimposed or connected together.

The sheet according to the invention can further include in or on its substrate or one of its layers (base, electroconductive, optical, etc.), particles of ferromagnetic material. These particles make it possible to modify the magnetic permeability of the sheet in such a way as to modifier locally or not its faculty of modifying a magnetic field to which it is subjected. This can for example make it possible to add properties for filtering certain waves to the sheet. In the case where the sheet would include a coil, the latter could include an iron core/kernel, cobalt or nickel in order to increase its magnetic permeability and as such improve its coupling with another coil of the sheet for example.

The sheet according to the invention can furthermore include means or be treated to increase its thermal diffusivity, with the latter depending in particular on the capacity of the sheet to conduct the heat (its heat conductivity) and on its capacity to store the heat (heat capacity). In the case where the sheet is intended to be associated to electronic equipment, it is preferable that the sheet have a good thermal diffusivity so that the heat generated during operation by this equipment can be dissipated.

The dissipation of the heat can be carried out on the surface or in the mass. In order to provide a good dissipation of the heat on the surface of the sheet, an aluminium film can be integrated to the sheet, for example under the base layer or on the paper forming support. This aluminium film can have a thickness of approximately 15 µm. In order to dissipate the heat in the mass, it is possible to provide in the material of the paper support specific fillers intended to increase the thermal conductivity of this paper. These fillers can be nanoparticles of diamond, fibres or carbon black, or oxides, nitrides and carbides such as for example: $Al_2O_3$, AlN, $MgO_2$, ZnO, BN, $SiN_4$, SiC and $SiO_2$.

The invention shall be better understood and other details, characteristics and advantages of this invention shall appear more clearly when reading the following description given by way of a non-restricted example and in reference to the annexed drawings wherein.

Figure 1:
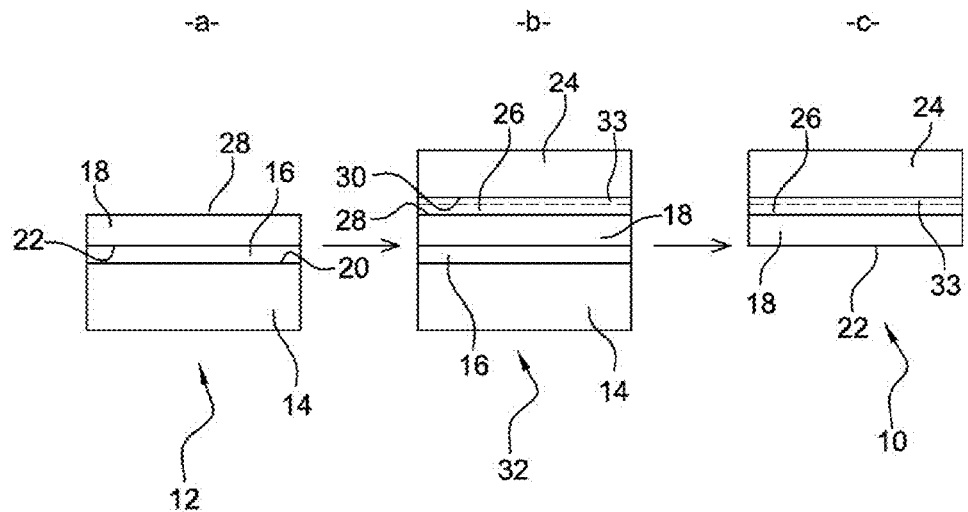
FIG. 1 shows in a very diagrammatical manner steps of the method for producing a sheet according to the invention.

Reference is first made to FIG. 1 which shows in a very diagrammatical manner steps a/, b/ and c/ of the method for producing a sheet according to the invention.

The step a/ of the method consists of preparing a multi-layer structure 12 comprising a lower plastic film 14, an anti-adhesive intermediary coating 16 and an upper base layer 18. The preparation of this structure 12 can be carried out in one step or several successive steps.

The anti-adhesive coating 16 and the base layer 18 can be deposited simultaneously onto the plastic film 14, by a curtain coating technique for example.

Alternatively, the anti-adhesive coating 16 is deposited onto the plastic film 14, then the base layer 18 is deposited on the anti-adhesive coating.

The surface quality of the upper side 20 of the plastic film 14 is transmitted to the lower side 22 of the base layer 18 (by the intermediary of the anti-adhesive coating 16). The surface characteristics of the side 22 of the base layer are therefore defined by those of the side 20 of the plastic film 14.

After drying and/or solidification of the base layer, the surface characteristics of the side 22 are frozen and are not intended to be modified during other steps of the method, and in particular the transfer of the base layer 18 onto a substrate 24, such as a paper, to be coated.

The step b/ of the method consists of depositing a layer or a film of adhesive 26 onto the upper side 28 of the base layer 18 or onto the lower side 30 to be coated of the substrate 24, even on these two sides 28, 30, then in applying these sides 28, 30 against one another in order to laminate or cross-laminate the multi-layer structure 12 and the substrate 24, and as such form a laminated or cross-laminated product 32.

The step c/ of the method consists of removing the plastic film 14 and the anti-adhesive coating 16 of the base layer 18, in such a way that only this layer 18 remains (with the adhesive 26) on the substrate 24.

These steps b/ and c/ can be carried out simultaneously or one after the other. In this latter case, the adhesive 26 is advantageously in the dry state and/or solidified during the removal of the plastic film 14.

At the end of the step c/, the side 22 of the base layer 18 is exposed, with this side being relatively smooth.

Figure 2:
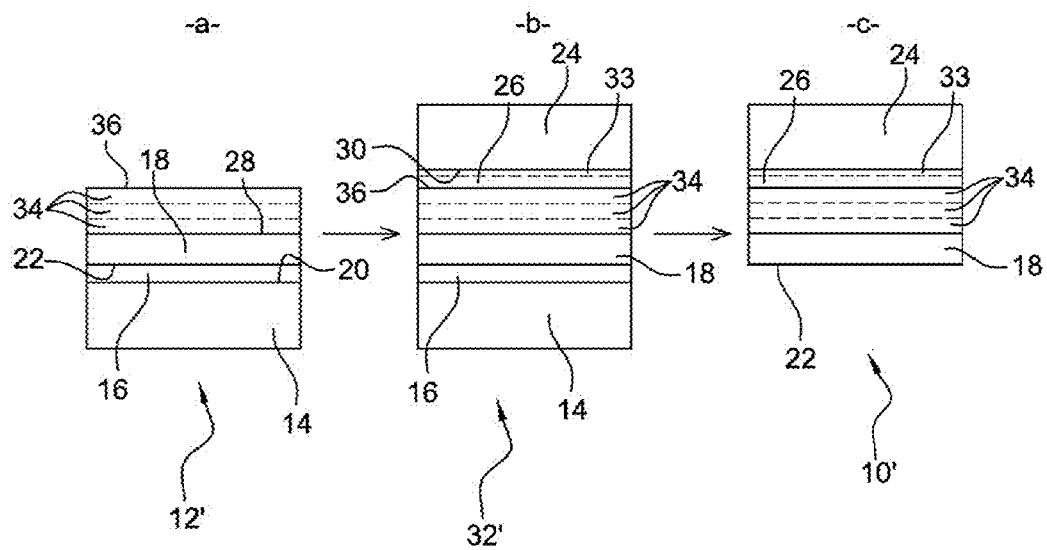
FIG. 2 shows in a very diagrammatical manner an alternative embodiment of the method according to the invention.

FIG. 2 shows an alternative embodiment of the method according to the invention, and differs from the method described hereinabove in reference to FIG. 1, in particular in that the multi-layer structure 12' further comprises at least one additional layer 34 deposited onto the upper side 28 of the base layer 18.

Several additional superimposed layers 34 can be deposited (simultaneously or successively) onto the side 28 of the base layer 18.

During the step b/, the lower side 30 of the substrate 24 or the upper free side 36 of the additional layer 34 (the farthest away from the plastic film, in the case where the structure 12' comprises several additional layers) is covered with adhesive 26. Alternatively, these two sides 30, 36 are covered with adhesive 26.

During the step c/, the multi-layer structure 12' and the substrate 24 are laminated or cross-laminated, in such a way as to form a laminated or cross-laminated product 32', then the plastic film 14 and the anti-adhesive coating are removed, in such a way as to expose the smooth or ultra-smooth side 22 of the base layer 18 of the sheet 10'.

The nature of the base layer 18 of the sheet can vary according to the embodiment of the method according to the invention.

The base layer 18 can be carried out in an electroconductive material and for example metal. The base layer 18 is for example formed of a thin layer of gold which is deposited on the anti-adhesive coating 16 by vacuum depositing or by any other suitable technique.

Alternatively, the base layer 18 can per se not be electroconductive and can then be coated with an electroconductive film (step d1/ of the method) or printed with an ink having electrical properties (step d2/).

In the case where the base layer 18 is covered with a metal film, the latter can be formed in situ on the base layer or added and affixed, for example by gluing, onto the base layer. This film is for example a gold film.

In the case where the base layer 18 is printable, it can be formed from a resin or from a printable varnish or from a paper coating comprising a binder and possibly pigments. The layer 18 is printable by any suitable technique, as the ink is intended to be deposited onto the smooth side 22 of the sheet 10.

The ink can include metal particles, particles of carbon and/or conductive polymers, with the particles able to be micrometric or nanometric. The step d2/ can include a sub-step wherein the printed sheet is subjected to a step of annealing so that the layer of ink forms a continuous electroconductive layer. This is for example the case when the ink comprises metal particles which are intended to coalesce during the step of annealing.

All of the embodiments make it possible to produce an electroconductive sheet, i.e. a sheet comprising at least one layer having good electrical conductivity, and in particular having a resistance per square less than 0.3 $\Omega$/sq, more preferably less than 0.15 $\Omega$/sq, and for example until a resistance of approximately 0.05 $\Omega$/sq.

Measuring the resistance per square of a sheet according to the invention can be carried out by means of a 4-point device or apparatus. This method uses sporadic contacts arranged on the surface of the sheet. These contacts are carried out via metal tips. Two tips are used to supply a current and two other tips are used to measure a voltage. The four tips are arranged at the four corners of a virtual square at the surface of the sheet or are aligned one after the other on a virtual line at the surface of the paper. It is possible to use a Jandel 4-tip device (universal Probe) coupled to a Jandel RM3 current generator which provides a currant ranging from 10 nA to 99 Ma. The resistances measured are expressed in Ohms per square (ohm/□ or $\Omega$/sq) and they are denoted as R□. The device measures the $\Delta V/I$ ratio that can be connected to the resistivity of the sheet. The case of a thin layer with thickness e and with resistivity $\rho$ is used. The thickness being negligible with regards to the other dimensions, a two-dimensional model for the conduction can be implemented and which gives: $V/I=K \cdot \rho/e=K.R\square$. K is a non-dimensional coefficient characteristic of the geometry 2D. The $\rho/e$ ratio characterises the layer, it is denoted as R□(ohm/□). The coefficient K can be calculated analytically in particular simple cases: $K=\log(2)/\pi$.

Examples that illustrate this invention shall now be described in what follows.

EXAMPLE 1

Carrying Out Multi-Layer Structures and Sheets According to the Steps a/ to c/ of the Method According to the Invention Several multi-layer structures were carried out by reproducing the step a/ of the method according to the invention, using substrates made of paper (Bristol boards and Maine gloss from the Arjowiggins company).

Tests were carried out in order to determine the most suitable adhesives for the carrying out of the step b/ of the method. The adhesive used must provide a fastening of the paper on the layer with regards to the multi-layer structure, that is sufficient in order to prevent it from become detached from this layer during the removal of the plastic film in step c/.

We have tested three types of adhesive: a/ a two-component PU adhesive with solvent (reference AD 1048 from the Rexor company), b/ a single-component PU adhesive with solvent (reference NC 320 from the COIM company), and c/ a single-component PU adhesive without solvent (reference SF2930 from the COIM company).

Tests were carried out using an adhesive tape in order to determine the level of adhesion of the papers on the multi-layer structures. The best results were obtained when the PU adhesive was applied onto the multi-layer structure rather than onto the paper, when the adhesive a/ was used to glue the Bristol board and when the adhesive b/ was used to glue the Maine gloss paper.

EXAMPLE 2

Preparation of a Sheet Comprising a Thin Film of Gold which is Formed In Situ on the Base Layer of the Sheet (Method with Step d1/)

The depositing of a gold film onto the base layer of a sheet obtained by the method according to the invention, is carried out in a vacuum by means of a DEP280 machine. This machine makes it possible to vacuum deposit many metals such as titanium, copper or gold. In this case, a fine layer of gold is deposited on the base layer of the sheet. Beforehand, the sheet is placed in the oven in order to be degassed (100° C.). As such, the pressure decreases. The pressure in the enclosure stands at $9.5 \cdot 10^{-7}$ mbar (for approximately 14 minutes) and at $8.10^{-7}$ mbar (for approximately 25 minutes). A pre-spraying takes place first of all for 120 seconds. Spraying for 375 seconds then follows. The depositing of gold on the sheet in the end is 30 nm thick. It is possible to place up to three sheets to be treated simultaneously in the machine.

EXAMPLE 3

Carrying Out a Step of Photolithography Using a Sheet Coated with a Metal Layer, Such as that Obtained in Example 2

A positive resin of 1.8 μm of thickness (representing approximately 2 mL of resin) is deposited via spin-coating onto a sample (dimensions 11*11 cm) of a sheet coated with a metal layer, such as that obtained in example 2, by rotation at a speed of 3000 rpm. This operation lasts approximately 15 seconds. The difference between a positive resin and a negative resin is made during the development of zones subjected to the rays of photolithography (lighting). In the first case, it is the exposed zones which disappear during the development; in the second case, it is the unexposed zones.

The sheet is placed in the oven for cross-linking of the resin. This is done at a temperature of 115° C. and for a duration of approximately 5 minutes. For the step of lighting, a quartz mask is arranged on the sheet, this mask comprising patterns, and the rays being intended to pass on zones where there is no pattern.

The lighting is carried out at a power of 5 mW and lasts 10 seconds. This time depends on the thickness of the resin deposited and on the power of the rays. Once this step is complete, the mask is cleaned with acetone. The phase of development can then take place. A product called tetramethylammonium hydroxide (MF-319) is used to develop after lighting. This step lasts one minute. This makes it possible to make the patterns that can be seen with the unaided eye appear on the sheet. As this here entails a positive resin, the developer removes the exposed resin. The sheet is then placed in an etching bath in order remove the exposed resin remaining on the metal layer. A mixture of potassium iodide/iodine ($KI/I_2$) is used. This step lasts twenty seconds. After a rinsing with water, then only the metal layer and the unexposed resin remain. The sheet is annealed at 115° C. for a few minutes for the purposes of removing as much water as possible. The resin is then removed from the metal layer via stripping. For this, the sample is dipped into an acetone bath for fifteen minutes with ultrasound in order to remove the residual resin.

The sheet has a very good thermal stability and is not altered by the successive heat treatments.

EXAMPLE 4

Carrying Out of a Step of Laser Ablation of a Metal Layer Deposited onto a Sheet, Such as that Obtained in Example 2

The ablation laser can be carried out by means of a Tamarack Scientific machine. A laser ablates zones defined by an operator. The metal layer (such as gold) which undergoes the stress of the laser begins by absorbing the impact, then the heat of the latter propagates. A difference in dilatation is created due to this phenomenon, which results in the final ablation of the metal. This technique of ablation is subtractive and of the direct patterning type. This means that the pattern is carried out without adding any product. Here, it is the laser beam which passes through a mask and pulls off the matter from its support. The power of the beam is adjusted according to the material and the quantity of material to be sampled. The final results after laser ablation of the materials depend on the influence of the nature and of the thermal and mechanical properties of the materials.

The tests showed good thermal and mechanical resistance of the sheet to laser ablation and a good definition of the patterns created via laser.

EXAMPLE 5

Example of Producing an Electronic Component Using Sheets Obtained in Examples 3 and 4

The metal layers of the sheets obtained in examples 3 and 4 were coated with a layer of a dielectric material, then these dielectric layers were themselves coated with a thin layer of silver in order to carry out capacities.

Other metal layers of the sheets obtained in examples 3 and 4 were printed with a carbon ink in order to carry out resistors.

EXAMPLE 6

Example of Producing Sheets Each Comprising a Printable Base Layer

The method according to the invention is used to produce sheets each comprising a base layer which is printable, in particular with inks having electrical properties.

Three different paper coatings were used, which are respectively identified by the letters A, B and C. These are layers with a finely ground calcium carbonate base (marketed under the brand Carbital 95) and binders. The other products of each layer are used to adjust the viscosity, to cross-link the binder or to favour the spreading of the layer.

The difference between the layers A, B and C is primarily their binder rate, which is 16.2% for the layer A, 8.8% for the layer B, and 16.2% for the layer C (of which 8.1% binder and 8.1% co-binder or adhesion promoter), in dry weight in relation to the total dry weight (or total dry matter weight) of the layer.

Details of the compositions of these layers are provided in the following table.

|  | Layer A | | Layer B | | Layer C | |
| --- | --- | --- | --- | --- | --- | --- |
| Components | Wet weight | Dry weight | Wet weight | Dry weight | Wet weight | Dry weight |
| Water | 502.273 | 0.000 | 60.724 | 0.000 | 39.177 | 0.000 |
| Alkali Ammonia 20% | 2.623 | 0.000 | 0.317 | 0.000 | 0.205 | 0.000 |
| Dispex N40 | 2.623 | 1.705 | 0.317 | 0.206 | 0.205 | 0.133 |
| Dried purified fine salt | 2.914 | 2.914 | 0.352 | 0.352 | 0.227 | 0.227 |
| Calgon PTH | 0.058 | 0.029 | 0.007 | 0.004 | 0.005 | 0.002 |
| Empicol LZ | 0.058 | 0.029 | 0.007 | 0.004 | 0.005 | 0.002 |
| Defoamer 1512M | 0.204 | 0.102 | 0.025 | 0.012 | 0.016 | 0.008 |
| Agnique EHS 75E | 2.331 | 1.247 | 0.282 | 0.151 | 0.182 | 0.097 |
| Surfinol 420 | 0.729 | 0.342 | 0.088 | 0.041 | 0.057 | 0.027 |
| Carbital 95 78% | 474.565 | 727.366 | 57.374 | 87.937 | 37.016 | 56.734 |
| Styronal D517 | 190.617 | 97.215 | 11.519 | 5.875 | 7.432 | 3.790 |
| Acronal S305 | 94.066 | 48.444 | 5.683 | 2.927 | 3.666 | 1.888 |
| AZC | 29.141 | 19.816 | 3.523 | 2.396 | 2.273 | 1.546 |
| Sterocoll FD | 1.311 | 0.688 | 0.159 | 0.083 | 0.102 | 0.054 |
| Defoamer 1512M | 0.204 | 0.102 | 0.025 | 0.012 | 0.016 | 0.008 |
| Diamond | 0.000 | 0.000 | 0.000 | 0.000 | 28.392 | 5.678 |

-continued

| Components | Layer A Wet weight | Layer A Dry weight | Layer B Wet weight | Layer B Dry weight | Layer C Wet weight | Layer C Dry weight |
|---|---|---|---|---|---|---|
| Total dry weight (Kg) | | 900 | | 100 | | 70 |
| Total wet weight (Kg) | | 1303 | | 140 | | 119 |
| Binder rate (in relation to the total dry matter weight) | 16.2% in dry weight | | 8.8% in dry weight | | 16.2% in dry weight | |
| Binder rate (in relation to the dry weight of pigments) | 20% in dry weight | | 10% in dry weight | | 20% in dry weight | |

Alkali Ammonia 20% is an aqueous solution. Dispex N40 is an anionic polyacrylate which is used as a dispersant and emulsifier in solution. Calgon PTH is a phosphate which is used as a dispersant in powder form. Empicol LZ is a wetting agent in the form of powder. Agnique EHS 75E is a liquid wetting agent. Surfinol 420 is used as an anti-foaming agent, dispersant and wetting agent. Carbital 95 78% represents pigments of calcium carbonates in a liquid medium. Styronal D517 and Acronal S305 are latexes that form binders. Styronal D517 is a styrene butadiene latex and Acronal S305 is a styrene/butyl acrylate (styrene-acrylic). AZC (ammonium-zirconium carbonate) is a liquid insolubilising agent. Sterocoll FD is an acrylic acid that is used as a rheology modifier. Defoamer 1512 M is a liquid anti-foaming agent and Diamond is a co-binder or adhesion promoter with an ethylene copolymer—acrylic acid (EAA) base.

Several papers marketed by the Arjowiggins company were used to produce sheets with the method according to the invention. Each sheet comprises a printable layer (A, B or C) or two superimposed printable layers (A+A, A+B or A+C). In the case of a sheet with two printable layers, a first layer A is deposited on the adhesive and is therefore located under the second layer or external layer (A, B or C) in the final product.

Two plastic PET films, used as a donor in the method, were tested. The first is a standard PET film and the second is a smoother PET film (referenced as 42).

The following table summarises the characteristics of the various sheets carried out by the method according to the invention.

Printing tests via piezoelectric effect ink-jet by means of a Dimatix machine from Fujifilm and by screen printing were carried out. Two types of ink were used (Sunjet U5603 and SICPA 9SP7214), with a silver nanoparticle base.

The base layer of a sheet can be printed by a layer of ink and then subjected to a step of annealing, before again being printed with another layer of ink and subjected to another step of annealing. In this case, after the first step of annealing, the sheet can be stored in a suitable location and/or subjected to a particular treatment, so that it recovers its initial humidity rate (before annealing), before being printed again.

| Test no. | Paper | Thickness of the paper (mm) | Paper weight (g/m²) | Type of layer | Layer(s) | Plastic film (donor) | Type of printing | Reference of the ink used | Number of layers of ink | Annealing method | Annealing temperature (° C.) | Annealing time (min) | Raverage (Ω/square) |
|---|---|---|---|---|---|---|---|---|---|---|---|---|---|
| 1 | Maine gloss 2858 offset hot chamber | 117 | 135 | porous | B | PET standard | Ink jet | Sunjet U5603 | 2 | IR dryer | 150 to 200 | 3 | 0.588 |
| 2 | Maine gloss 2933 offset hot chamber | 111 | 135 | porous | A + B | PET 42 | Ink jet | Sunjet U5603 | 2 | | | | 3.41 |
| 3 | Maine 135 offset base | 102 | 191 | porous | without | | Ink jet | Sunjet U5603 | 2 | | | | 0.287 |
| 4 | Maine 2934 indigo without hot chamber | 111 | 135 | closed | A + C | PET 42 | Ink jet | Sunjet U5603 | 2 | | | | 0.051 |
| 5 | Bristol 2932 electronic hot chamber | 205 | 200 | closed | A + A | PET 42 | Ink jet | Sunjet U5603 | 1 | | | | 0.3 |
| 6 | Maine gloss 2947 electronic hot chamber | 113 | 135 | closed | A + A | PET 42 | Ink jet | Sunjet U5603 | 1 | | | 2 | 0.3 |
| 7 | Maine gloss 2947 electronic hot chamber | 113 | 135 | closed | A + A | PET 42 | Ink jet | Sunjet U5603 | 2 | | | 3 | 0.07 |
| 8 | Bristol 2828 electronic 1 layer | 275 | 250 | closed | A | PET standard | Screen printing | SICPA 9SP7214 | 1 | No annealing | No annealing | 3 | 0.084 |
| 9 | Bristol 2828 electronic 1 layer | 275 | 250 | closed | A | PET standard | Screen printing | SICPA 9SP7214 | 1 | Oven | 165 | 3 | 0.078 |
| 10 | Bristol 2828 electronic 2 layers | 275 | 250 | closed | A + A | PET standard | Screen printing | SICPA 9SP7214 | 2 | No annealing | No annealing | 3 | 0.244 |
| 11 | Bristol 2828 electronic 2 layers | 275 | 250 | closed | A + A | PET standard | Screen printing | SICPA 9SP7214 | 2 | Oven | 165 | 3 | 0.078 |

-continued

| Test no. | Paper | Thickness of the paper (mm) | Paper weight (g/m²) | Type of layer | Layer(s) | Plastic film (donor) | Type of printing | Reference of the ink used | Number of layers of ink | Annealing method | Annealing temperature (° C.) | Annealing time (min) | Raverage (Ω/square) |
|---|---|---|---|---|---|---|---|---|---|---|---|---|---|
| 12 | Maine 2828 electronic 1 layer | 64 | 80 | closed | A | PET standard | Screen printing | SICPA 9SP7214 | 1 | No annealing | No annealing | 3 | 0.126 |
| 13 | Maine 2828 electronic 1 layer | 64 | 80 | closed | A | PET standard | Screen printing | SICPA 9SP7214 | 1 | Oven | 165 | 3 | 0.074 |
| 14 | Maine 2828 electronic 2 layers | 64 | 80 | closed | A + A | PET standard | Screen printing | SICPA 9SP7214 | 2 | No annealing | No annealing | 3 | 0.322 |
| 15 | Maine 2828 electronic 2 layers | 64 | 80 | closed | A + A | PET standard | Screen printing | SICPA 9SP7214 | 2 | Oven | 165 | 3 | 0.144 |
| 16 | PEN Teonex Q65FA125 | 122 | | | | | Ink jet | Sunjet U5603 | 2 | IR dryer | 150 to 200 | 2.5 | 0.141 |

The resistances of the layers of ink must be as low as possible. It is observed that the number of prints of a paper has an influence on its resistance. The more layers of ink the paper comprises, the lower its resistance is. When the tests 3, 4 and 7 concerning the papers coated with two layers of ink are compared, it is observed that the closed layers of tests 4 and 7 have a lower resistance than the porous layer of the test 3. The sheets comprising a closed external layer (A or C) have good results in terms of resistance. On the contrary, each sheet having a layer B, which is a porous or open layer, does not have good results in this regard (see the first two tests).

This can be explained by the fact that the porous layers allow the ink to be absorbed in the sheet, with the layer of ink thus not being continuous on the surface.

Figure 3:
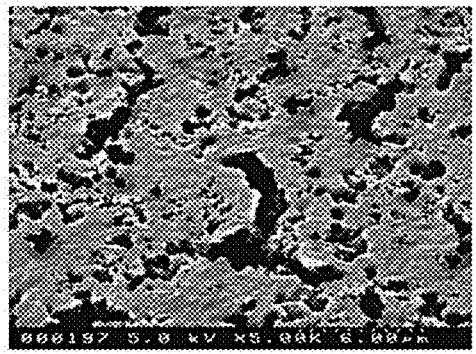
FIGS. 3 and 4 are images obtained by a scanning electron microscope (SEEM) of sheets, with FIG. 4 corresponding to a sheet obtained by the method according to the invention.
Figure 4:
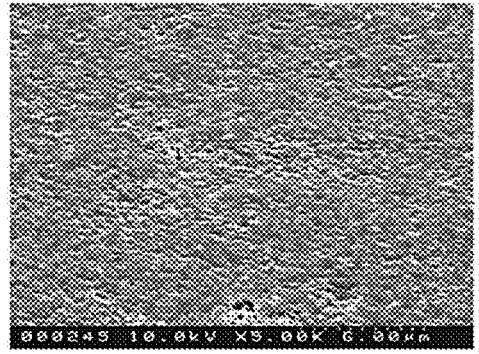

These differences in porosity between the sheets are clearly visible in FIGS. 3 and 4 which show SEM photographs of surfaces to be printed with Maine gloss 2858 (porous or open sheet—first test) and Maine 2828 (closed or non porous sheet—tests 12 to 15) sheets, respectively.

The porosity of a layer can be characterised by its binder rate and this can be measured by carrying out a test with pore size inks.

The test with pore size inks makes it possible to measure the absorption capacity of a sheet and the ink speed penetration, by the depositing of a special ink (comprising a black colouring) on this sheet and by studying its behaviour over time. This test furthermore makes it possible to assess the change in the optical density of a sheet after printing.

The ink used here is a pore size ink from the Lorilleux company, marketed under the reference 3809. This is a varnish wherein a low percentage of black colouring has been dissolved.

The sheet is fixed onto a clean and smooth work surface using adhesive tape. A bronze metal stamp, with a diameter of 2.4 mm and a mass equal to 328 g, inked beforehand (thin film), deposits a button of ink on the surface to be tested. After a lapse of time of contact evaluated with the chronometer (t=0, 7, 15, 30, 60 and 120 s), the excess ink is completely wiped with a cloth (more preferably soft and lint-free). It is imperative that the operation be carried out in a single movement, in a single direction, with firmness in order to prevent leaving residue on the print. This movement as such generates, behind it, another clear print in the shape of a comet tail.

The ink, by penetrating into the sheet, more or less tints its surface according to the quantity of ink absorbed. The optical density of the stains on the sheet is measured with a reflection densitometer. The change in the optical density can as such be assessed according to the penetration time of the ink and have a global indication on the speed and the capacity of absorption of the sheet.

The following table shows the change in the optical density of the inks deposited onto the printable base layers of several sheets obtained par the method according to the invention, according to the time elapsed (in seconds) after the depositing of the ink onto these layers.

| Test no. | Paper | t = 0 s | t = 7 s | t = 15 s | t = 30 s | t = 60 s | t = 120 s |
|---|---|---|---|---|---|---|---|
| 12 to 15 | Maine 2828 | 0.08 | 0.1 | 0.09 | 0.1 | 0.1 | 0.1 |
| 17 | Opale 2858 | 0.15 | 0.17 | 0.23 | 0.27 | 0.32 | 0.4 |
| 8 to 11 | Bristol 2828 | 0.08 | 0.09 | 0.09 | 0.1 | 0.09 | 0.11 |
| 1 | Maine single component 2858 | 0.13 | 0.14 | 0.17 | 0.2 | 0.26 | 0.32 |
| 18 | Stoneywood 2935 | 0.08 | 0.09 | 0.11 | 0.1 | 0.1 | 0.1 |
| 19 | Paper Chromolux 300 | 0.18 | 0.21 | 0.21 | 0.31 | 0.39 | 0.56 |
| 20 | Paper Chromolux 180 | 0.13 | 0.16 | 0.17 | 0.26 | 0.32 | 0.44 |
| 21 | Bristol 2930 hot chamber | 0.18 | 0.19 | 0.21 | 0.27 | 0.32 | 0.33 |
| 22 | Bristol 2931 hot chamber | 0.14 | 0.14 | 0.18 | 0.16 | 0.2 | 0.19 |
| 5 | Bristol 2932 hot chamber | 0.05 | 0.06 | 0.06 | 0.08 | 0.08 | 0.09 |
| 2 | Maine gloss 2933 hot chamber | 0.21 | 0.22 | 0.27 | 0.28 | 0.32 | 0.37 |
| 4 | Maine indigo 2934 hot chamber | 0.12 | 0.14 | 0.13 | 0.18 | 0.18 | 0.15 |
| 6 | Maine gloss 2947 hot chamber | 0.09 | 0.09 | 0.09 | 0.09 | 0.11 | 0.12 |
| 3 | Maine base | 0.26 | 0.3 | 0.3 | 0.34 | 0.4 | 0.47 |

A closed layer is characterised by a low density of ink at 0s and no or little change in this density over time. On the contrary, a porous layer will have a higher density right from the start and especially an increase in the density over time.

It is observed that the sheets with a porous base layer (tests 1 to 3 and 17 to 21) do not have good results (substantial variation in the optical density of the inks over time) contrary to sheets with a closed layer base (tests 4 to 15 and 22).

It is therefore important to use sheets that each have a printable base layer. In the case of a printable base layer, this porosity is, as explained hereinabove, controlled by the binder rate of the base layer which must, according to the invention, be higher than 15% in dry weight in relation to the dry weight of the layer. No difference was observed for the type of film used for the donor.

EXAMPLE 7

Evaluation of the Surface Porosity of Sheets Obtained by the Method According to the Invention, by Measuring the Open Fraction of the Surfaces of these Sheets Determined Via Image Analysis SEM images such as those obtained in the example 6 and shown in FIGS. 3 and 4 were analysed in order to measure the surface fraction of the pores at the surface of the base layers of the sheets. It is observed that the surface fractions of porosity of the sheets are highly variable.

| Test no. | Paper | Rate of binder(s) in % (dry weight) | Open fraction (%) |
|---|---|---|---|
| 8 to 15 | 2828 | 16.2 | 0.08 |
| 1 | 2858 | 8.8 | 4.3 |
| 21 | 2930 | 8.8 | 5.27 |
| 22 | 2931 | 8.1 + 8.1 Diamond | 1.55 |
| 2 | 2933 | 8.8 | 1.88 |
| 4 | 2934 | 16.2 | 0.81 |
| 6 to 7 | 2947 | 16.2 | 0.19 |

We first observe that the open surfaces are all relatively low (<6%). There is a substantial influence of the binder rate on the open fraction of the sheets. Indeed, the sheets with a binder rate of 16.2% in dry weight or more have an open fraction less than or equal to 1.55% while papers with a binder rate of 8.8% in dry weight or less have an open fraction greater than or equal to 1.88%. In addition, if the sheet 2931 (test no. 22), which has 8.1% binder and 8.1% co-binder (Diamond) is excluded, the results are even more substantiating.

The tableau hereinbelow summarises the influence of the binder rate on the properties of the sheets tested.

| Test no. | Paper | Binder rates in % (dry weight) | Open fraction (%) | Density of the pore size inks 0 s | Density of the pore size inks 120 s | Delta 120-0 | Silver ink resistance (Ω/sq) |
|---|---|---|---|---|---|---|---|
| 8-15 | 2828 | 16.2 | 0.08 | 0.08 | 0.1 | 0.02 | |
| 1 | 2858 | 8.8 | 4.3 | 0.15 | 0.4 | 0.25 | 0.59 |
| 21 | 2930 | 8.8 | 5.27 | 0.18 | 0.33 | 0.15 | |
| 22 | 2931 | 8.1 + 8.1 Diamond | 1.55 | 0.14 | 0.19 | 0.05 | |
| 2 | 2933 | 8.1 | 1.88 | 0.21 | 0.37 | 0.16 | 3.41 |
| 4 | 2934 | 16.2 | 0.81 | 0.12 | 0.15 | 0.03 | 0.051 |
| 6-7 | 2947 | 16.2 | 0.19 | 0.09 | 0.12 | 0.03 | 0.07 |

The sheets that have layers with binder rates of 8.8% (in dry weight) have porous surfaces, since the open fraction of these surfaces is high (at least 1.88%), which causes a strong absorption of liquids such as pore size inks. As such, the difference in optical density of the inks between 120 s and 0 s is greater than 0.1 for these sheets with porous coatings, while for the sheets having layers with a binder rate of 16.2% (in dry weight), the open fraction is low and the difference in optical density between 120 s and Os for the test with pore size inks is low (less than 0.1).

When these sheets are printed with inks comprising nanoparticles of silver, via a by ink jet, then when these sheets are subjected to a thermal annealing of about 150° C., we find that the resistance of the printed tracks is also linked to the binder rate of the sheets.

The sheets with layers having a high binder rate, therefore with a closed layer, provide printed tracks which are not very resistive (respectively 0.13 Ω/sq and 0.07 Ω/sq for the papers 2934 and 2947—tests 4 and 6-7). A value of 0.15 Ω/sq or less is considered to be good for printed PEN plastic films.

In the same conditions, the sheets with layer shaving a low binder rate, therefore with relatively open layers, provide printed tracks which are more resistant (respectively 0.59 Ω/sq and 3.4 Ω/sq). This can be explained by the fact that the conductive inks penetrate into the surface pores of the sheets and create defects in the tracks which make their resistivity increase.

We can therefore conclude from this that the binder rate strongly influences the aptitude for printing of these papers by inks having electrical properties.

EXAMPLE 8

Carrying Out Sheets with Printable Base Layers, Using Various Pigments

Additional tests were carried out in order to determine on the one hand the influence of the type of pigments and of the binder rate in the printable base layer, on the transfer carried out in the steps b/ and c/ of the method.

Several multi-layer structures were prepared according to the step a/of the method, with each of these structures comprising a printable base layer.

The tableau hereinbelow summarises the various pigments used in the base layers of the sheets as well as the binder rate of each of these couches. Thirteen different multi-layer structures were prepared (A to M).

| Test | Fillers | Binder rate [%] | Gloss at 75° [%] | Test with pore size inks 0 s | 7 s | 15 s | 60 s | 120 s |
|---|---|---|---|---|---|---|---|---|
| A | Kaolin | 9.1% | 8 | 1 | 1.2 | 1.3 | 1.4 | 1.4 |
| B | | 16.7% | 26 | 0.3 | 0.78 | 1.15 | 1.4 | 1.4 |
| C | | 23.1% | 44 | 0.25 | 0.45 | 0.8 | 1;1 | 1.1 |
| D | Calcium | 9.1% | 42 | 0.19 | 0.35 | 0.37 | 0.46 | 0.55 |
| E | carbonates | 16.7% | 87 | 0.06 | 0.07 | 0.07 | 0.11 | 0.14 |
| F | | 23.1% | 93 | 0.05 | 0.07 | 0.08 | 0.07 | 0.07 |
| G | Plastic | 9.1% | 17 | | | | | |
| H | fillers | 16.7% | 36 | 0.46 | 0.53 | 0.65 | 0.3 | 0.3 |
| I | | 23.1% | 73 | 0.21 | 0.36 | 0.25 | 0.62 | 0.65 |
| J | Nano | 9.1% | 4 | | | | | |
| K | TiO2 | 16.7% | 85 | | | | | |
| L | | 23.1% | 92 | 0.2 | 0.3 | 0.4 | 0.62 | 0.78 |
| M | Without filler | 100% | 103 | 0.07 | 0.07 | 0.07 | 0.07 | 0.07 |

The Kaolin is that marketed by the Golden Rock Kaolin company under the denomination Kaolin SC 90. The calcium carbonate is that marketed by the Imerys company under the name Carbital 95. The plastic fillers are marketed by the Rhom & Haas company under the name Ropaque Ultra E and the nanoparticles of titanium dioxide are marketed by the Kemira company under the reference US Titan L181.

It was observed that each multi-layer structure comprising a base layer having a binder rate less than 15% was not correctly transferred onto the substrate paper during the steps b/ and c/ of the method. Moreover, better transfer results were obtained with base layers of which the pigments are mineral fillers rather than plastic fillers. The best results were obtained with base layers of which the pigments are calcium carbonates because these layers are very glossy (and therefore smooth) and are closed (values for optical density that are relatively low and constant over time). The base layer that does not comprise any filler further has the advantage of having a high gloss and also of defining a closed surface.

EXAMPLE 9

Figure 5:
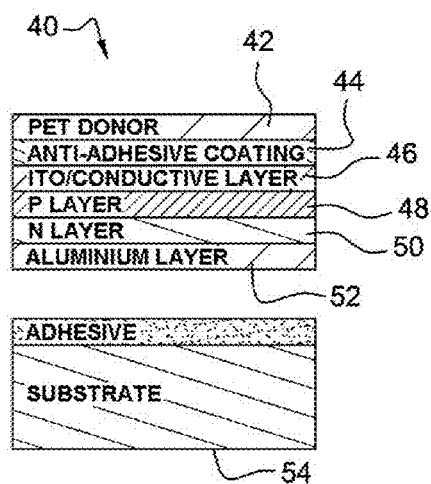
FIGS. 5 and 6 show in a very diagrammatical manner steps of another alternative embodiment of the method according to the invention.

Carrying Out an Embossed Electroconductive Sheet, for Carrying Out a Transistor for Example FIG. 5 shows a multi-layer structure 40 carried out by the method according to the invention, with this multi-layer structure 40 comprising a plastic film 42 made of PET on a side whereon are superimposed the following layers: an anti-adhesive coating 44, an electroconductive layer 46 of ITO (indium tin oxide), a layer 48 of P-doped semiconductor material, a layer 50 of N-doped semiconductor material, and a layer of aluminium 52. This structure is obtained after the step a/ of the method.

This multi-layer structure 40 is then glued on a substrate 54 made of paper (step b/), then the plastic film 42 is removed exposing the electroconductive layer 46 of ITO (step c/). An electroconductive sheet is thus obtained that can be used for the production of electronic components, such as a transistor.

Figure 6:
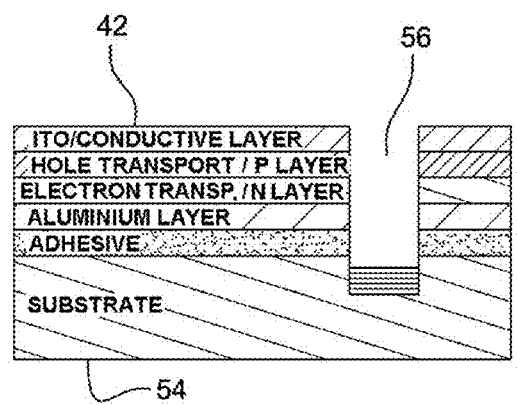

In an additional step of the method, the sheet is embossed by a suitable technique by exerting compression forces on the layer 46 of ITO (in a direction perpendicular to the plane of the sheet), in particular zones and by means of a suitable technique known to those skilled in the art. This creates recesses 56, as shown in FIG. 6, at the bottom of which are displaced portions of the layers 46 to 52, which remain superimposed on one another.

EXAMPLE 10

Carrying Out an Electroconductive Transparent Sheet

The method according to the invention was used to produce an electroconductive transparent sheet, this sheet comprising a tracing paper of 65 g/m² and having a transparency of 66%. A printable base layer with a calcium carbonate and comprising 50% in dry weight of binder in relation to the total dry matter weight of the base layer is transferred onto the tracing paper by the method. The tracing obtained has a transparency of 68.5% and a Bekk smoothness greater than 10,000 s. The transparent sheet was then printed with inks having electrical properties.

EXAMPLE 11

Measuring the Gloss and the Optical Density of Inks Printed on Sheets Prepared Using the Method According to the Invention Several sheets were prepared by the method according to the invention, these sheets are differentiated from one another by the binder rate of their printable base layers (with a calcium carbonate base), which varies between 9.1 and 23.1%.

The table hereinbelow summarises the results of the gloss measurements and of the tests with pore size inks carried out on six sheets.

| Tests | Binder rate | Gloss | Test with pore size inks | | | | |
|---|---|---|---|---|---|---|---|
| | | | 0 s | 7 s | 15 s | 60 s | 120 s |
| D | 9.1% | 42 | 0.19 | 0.35 | 0.37 | 0.46 | 0.55 |
| N | 14% | 70 | 0.09 | 0.15 | 0.17 | 0.2 | 0.23 |
| O | 15% | 78 | 0.08 | 0.13 | 0.14 | 0.17 | 0.2 |
| P | 16% | 84 | 0.06 | 0.09 | 0.1 | 0.12 | 0.15 |
| E | 16.7% | 87 | 0.06 | 0.07 | 0.08 | 0.11 | 0.14 |
| F | 23.1% | 93 | 0.05 | 0.07 | 0.08 | 0.07 | 0.07 |

It is observed that, above 15% in dry weight of binder in the base layer, the sheet comprises a gloss higher than 80 and an optical density less than or equal to 0.15 to 120 s, which means that the layer is not very absorbent and this constitutes good results.

Reference is now made to FIGS. 7 to 11 which show several embodiments of the method according to the invention for the production of a sheet of which at least one side comprises a zone of greater smoothness than the rest of this side, this zone extending on a surface less than that of the side.

Figure 7:
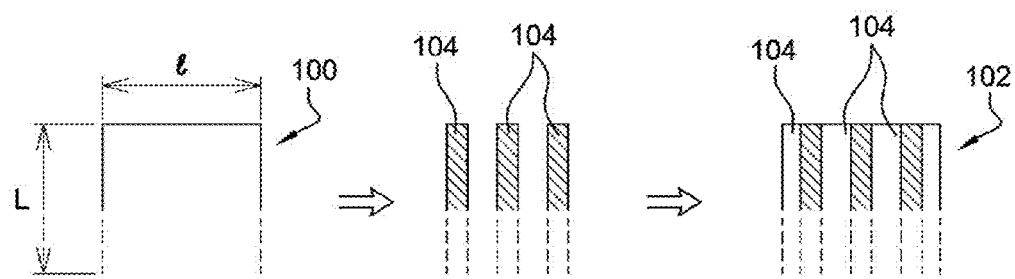
FIGS. 7 to 11 show in a very diagrammatical manner several embodiments of the method according to the invention.

In the case of FIG. 7, a plastic film 100 having relatively substantial dimensions (width l and length L) is used, with these dimensions being for example similar to those of the sheet or of the paper 102 intended to receive the multi-layer structure. The plastic film is for example made of PET and has a width of 1.5 m, a length of several tens of meters and a thickness of 5 to 20 μm approximately.

The multi-layer structure is prepared (step a)) using this plastic film 100 of large dimensions, as indicated hereinabove. This multi-layer structure can include an anti-adhesive coating, an electroconductive base layer, a layer of adhesive and a barrier layer. The multi-layer structure is then cut into strips 104 of which the length is equal to the initial length of the plastic film 100 and of which the width is for example of a few millimeters or centimeters.

One or several of these strips 104 are glued onto the paper 102 according to the step b). In the case of FIG. 7, the paper 102 receives three strips 104 which are substantially parallel and at a distance from one another. The portions of plastic film of these strips 104 can then be removed according to the step c) in such a way as to reveal independent base layers that define smooth zones and which each form an electroconductive layer or which are each intended to be covered with an electroconductive layer.

The paper 102 prepared as such can have large dimensions and be intended to be cut in order to produce A4 format papers for example. In a particular case for carrying out the invention, the paper 102 is cut in such a way that the strips 104 extend along longitudinal edges of the cut papers.

The embodiment shown in FIG. 7 is similar to the aforementioned case (iii) of the method according to the invention.

Figure 8:
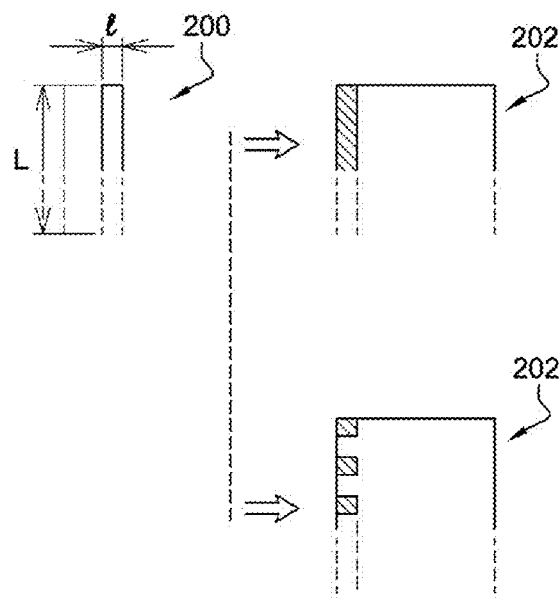

In the case of FIG. 8, the plastic film 200 initially has an extended shape and therefore has the shape of a strip of which the length L can be similar to that of the paper 202 intended to receive the multi-layer structure, and of which the width is clearly less than that of this paper and is for example of a few millimeters or centimeters.

The multi-layer structure is prepared (step a)) using this plastic film 200 and is then glued onto the paper 202 (step b)).

In the first case of FIG. 8 (in the upper right corner), the paper 202 receives a strip which extends along one of its longitudinal edges. This particular case is similar to the aforementioned case (iii) of the method according to the invention.

In the second case of FIG. 8 (in the lower right corner), the paper 202' receives a series of several portions of strip, which extends along one of the longitudinal edges of the paper. This paper 202' can be obtained in two ways. It can be obtained by arranging the adhesive on the multi-layer structure or the paper only in the zones where portions of strips must be glued (case (ii) and (iii) of the method according to the invention). As an alternative or additional characteristic, it would be possible to apply an adhesive pressure onto the strip only in the zones where corresponding portions of strips must be glued onto the paper. This can be carried out for example by means of an embossing press, a stamp press or a hot foil stamp press, which makes it possible to apply local pressures onto the paper when it is produced (in particular for a marking of the paper). In the second case of FIG. 8, the paper receives three separate portions of strips separated from one another, which each substantially have a square or rectangle shape.

The plastic film or the portions of plastic film can then be removed according to the step c) in such a way as to reveal the independent base layers that define zones of greater smoothness.

Figure 9:
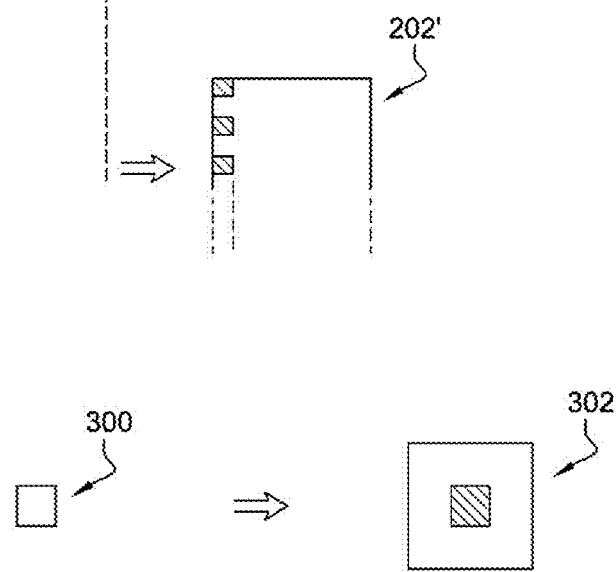

In the case of FIG. 9, the plastic film 300 has a square or rectangular shape of which the dimensions (width I and length L) are less than those of the paper 302 intended to receive the multi-layer structure.

The multi-layer structure is prepared (step a)) using this plastic film 300 and is then glued onto the paper 302 (step b)), in its centre in the example of FIG. 9. The plastic film can then be removed in such a way as to reveal the base layer (step c)).

The example embodiment shown in FIG. 9 is similar to the aforementioned cases (ii) and (iii) of the method according to the invention.

Figure 10:
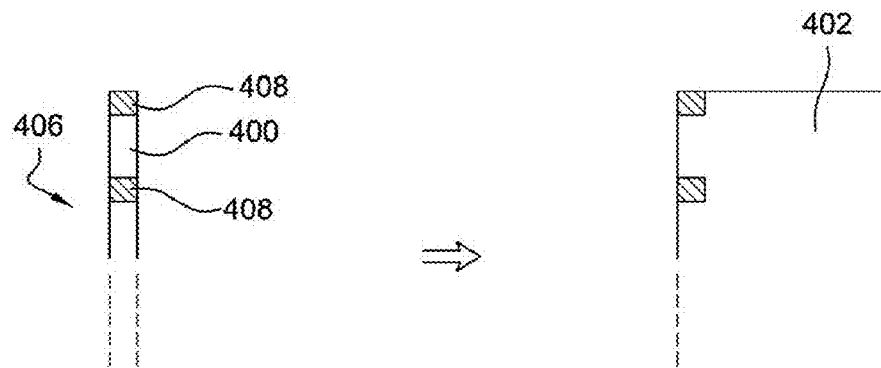

In the case of FIG. 10, the plastic film 400 has the shape of a strip similar to that of FIG. 8. The multi-layer structure 406 is prepared (step a)) using this strip by superimposing an anti-adhesive coating and a base layer onto portions 408 of this strip only. The multi-layer structure 406 is then glued onto a paper 402 (step b)) and the plastic film 400 is removed in order to reveal separate base layers on the paper 402, such as is shown in FIG. 10.

The example embodiment shown in FIG. 10 is similar to the aforementioned cases (i) and (iii) of the method according to the invention.

Figure 11:
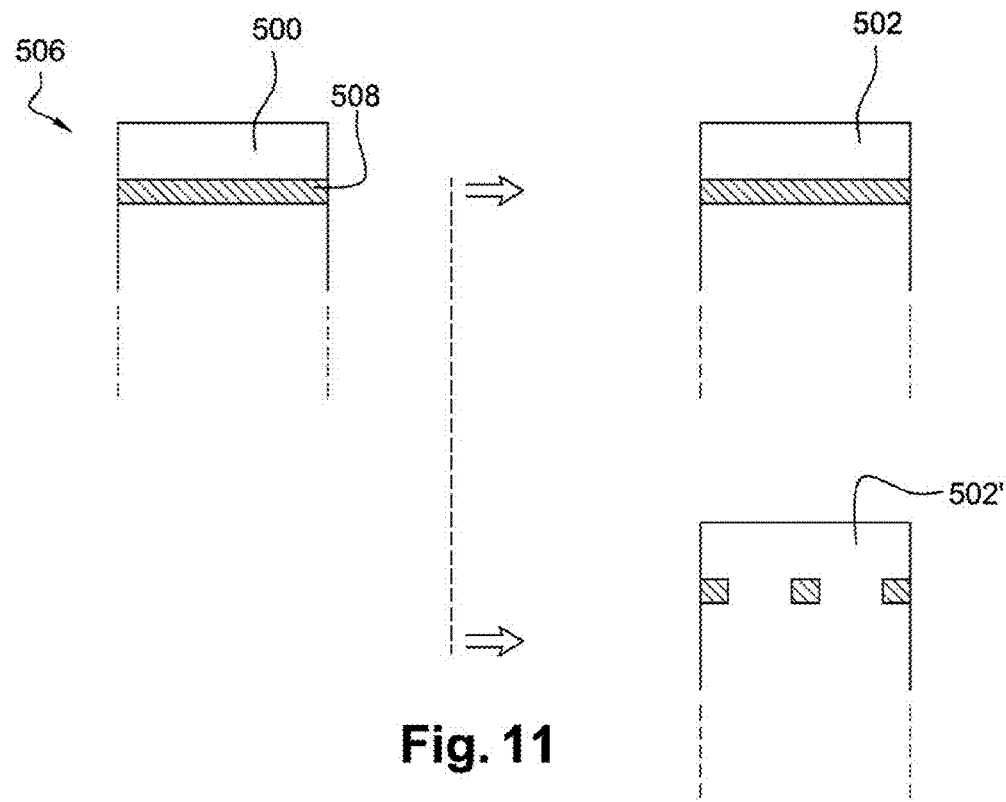

In the case of FIG. 11, the plastic film 500 has a shape similar to that of FIG. 7. The multi-layer structure 506 is prepared (step a)) using this film by superimposing an anti-adhesive coating and a base layer onto a strip 408 only of this film. The multi-layer structure 506 is then glued onto a paper 502 (step b)) and the plastic film 500 is removed in order to reveal a base layer of elongated shape on the paper 502, as is the case in the first embodiment shown in the upper right corner of the FIG. 11. This example of an embodiment is similar to the aforementioned case (i) of the method according to the invention.

In the alternative shown in the lower right corner of FIG. 11, the paper 502' receives a series of several portions of strips. This paper 502' can be obtained as explained hereinabove in relation with FIG. 8. The plastic film can then be removed according to the step c). This example of an embodiment can be similar to the aforementioned cases (i) and (ii) of the method according to the invention.

Figure 12:
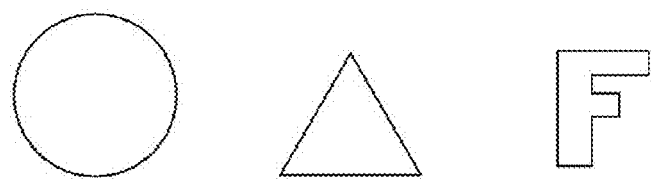
FIG. 12 shows particular geometrical shapes for the plastic film, the multi-layer structure and/or the base layer during the implementation of the method according to the invention.

As is diagrammatically shown in FIG. 12, the base layer and/or the electroconductive layer of the sheet prepared by the method according to the invention can have any shape such as a geometrical shape (circle, triangle, etc.) or the shape of a letter ("F" in the example shown). This shape can be imposed by the shape of the plastic film used (during the preparation of the multi-layer structure), of the multi-layer structure used (possibly after cutting), of the zone of the multi-layer structure or of the substrate whereon the adhesive is deposited, and/or of the support zones of the press used to cross-laminate the multi-layer structure and the substrate.

Figure 13:
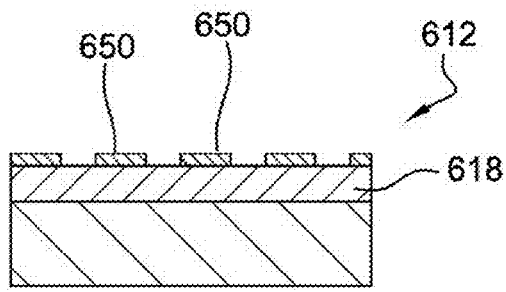
FIGS. 13 and 14 show in a very diagrammatical manner steps of an alternative embodiment of the method according to the invention.
Figure 14:
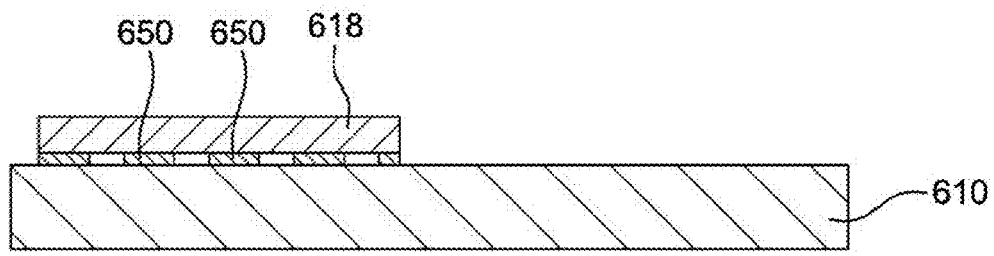

FIGS. 13 and 14 show another alternative of the method according to the invention wherein the free side of the base layer 618 of the multi-layer structure 612 is printed with electroconductive inks 650 or is covered with an electroconductive coating. This printed or covered side is then glued and applied onto a side of a substrate of a sheet 610. The multi-layer structure 612 can be cut before the step of laminating.

Figure 15:
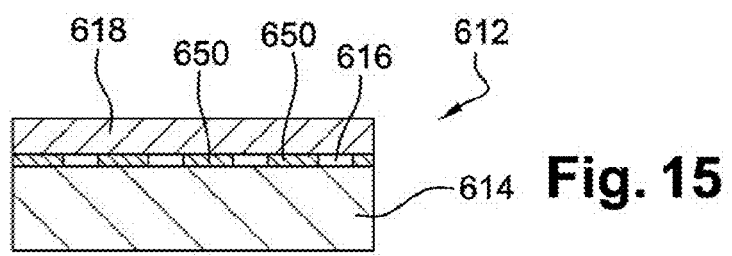
FIGS. 15 and 16 show in a very diagrammatical manner steps of another alternative embodiment of the method according to the invention.
Figure 16:
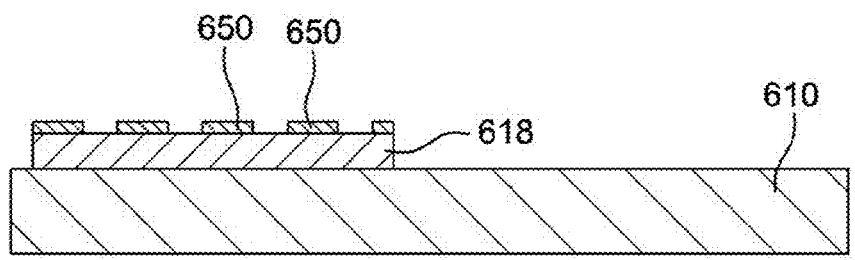

FIGS. 15 and 16 show another alternative of the method according to the invention wherein the anti-adhesive coating 616 deposited onto the plastic film 614 of the multi-layer structure is printed with electroconductive inks 650 or is covered with an electroconductive coating, before the base layer 618 is deposited. The base layer and this electroconductive layer (inks or coating) are then transferred onto the substrate of the sheet 610.

Figure 17:
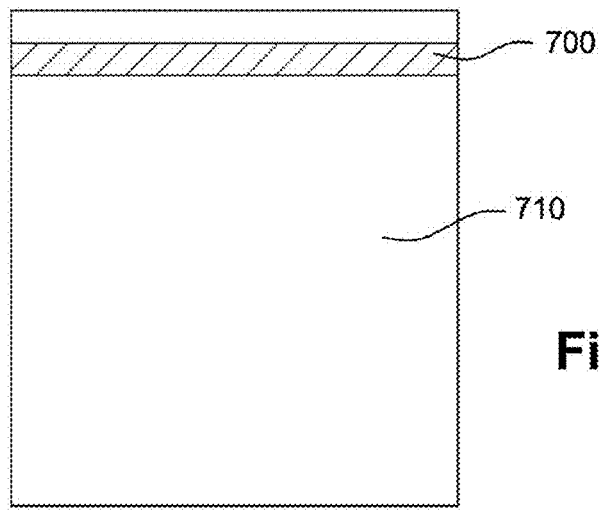
FIGS. 17 and 18 show sheets prepared by the method according to the invention.

FIG. 17 shows a sheet prepared by the method according to the invention in the aforementioned case (iv), i.e. in the case where the base layer is transferred onto the substrate of a first sheet, more preferably smooth, which is intended to be cut (into strips 700 in the example shown) and to be glued onto the substrate of another sheet 710.

Figure 18:
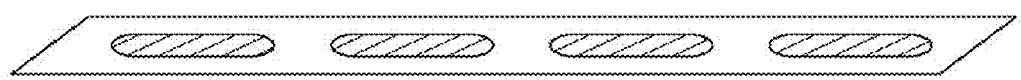

FIG. 18 shows another sheet prepared by the method according to the invention, in the form of a strip. The substrate of this sheet is formed by a paper covered with an anti-adhesive coating or by a plastic film. The plastic film or the anti-adhesive coating is here covered with four separate zones of a higher smoothness, i.e. with four zones comprising a smooth base layer which is electroconductive or which is associated or intended to be associated with an electroconductive layer. This sheet is particularly suitable for producing electronic labels.

Figure 19:
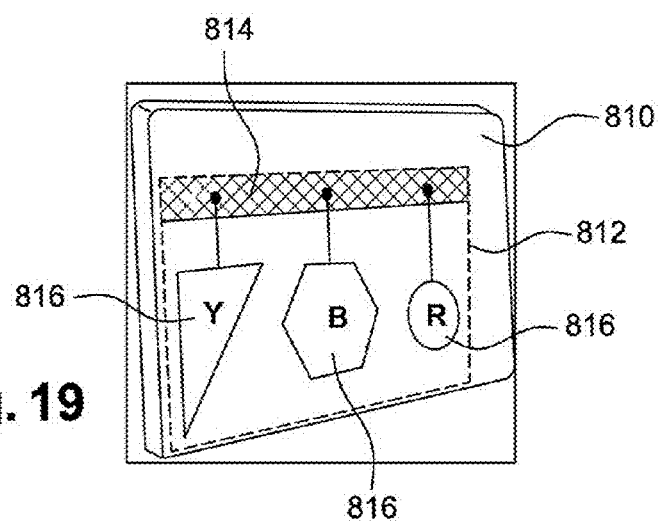
FIG. 19 shows another sheet prepared by the method according to the invention.

FIG. 19 shows another sheet prepared by the method according to the invention. This sheet 810 comprises a zone 812 of greater smoothness prepared in the manner described hereinabove. A portion of this zone 812 is covered by an electroconductive layer 814 whereon are deposited microdiodes such as those described in document WO2012/031096, and other separate portions of the zone 812 are covered by coloured layers 816 of polymer (respectively yellow (Y), blue (B) and red (R)) each forming a wave guide in contact or connected to the layer 814 by at least one strip of the same polymer material as the layer under consideration. When the electroconductive layer 814 is powered by an electric current, the micro-diodes emit a light beam which is transmitted to the layers 816 of polymer that themselves diffuse coloured lights.

EXAMPLE 12

Evaluation of the Thermal Diffusivity of Sheets

Sheets were tested in order to determine their thermal diffusivity on the surface (in XY) and in depth or in the mass (in Z).

The first tests were carried out on the following sheets:
3382: Powercoat® sheet (thickness 230 μm) marketed by the Arjowiggins company and obtained by the steps of the method according to the invention (without electroconductive layer),
3384: Powercoat® sheet with an aluminium film of 12 μm inserted between the paper and the base layer (thickness 240 μm)
GD 28.09.12/1: Control sample with a Cénibra/pacifico mixture refined to 52° SR (thickness 193 μm)
GD 28.09.12/2: Sample with a Cénibra/pacifico mixture refined to 52°SR and doped with 30% BN (thickness 193 μm)
GD 31.08.12/1: Control sample with a Cénibra/pacifico mixture refined to 40°SR (thickness 229 μm)
GD 31.08.12/4: Sample with a Cénibra/pacifico mixture refined to 40°SR doped with 20% Carbon fibres (thickness 355 μm)
GD 31.08.12/5: Sample with a Cénibra/pacifico mixture refined to 40°SR doped with 60% carbon black (thickness 294 μm)

In the first test, a sufficient number of sheets are stacked in order to have a total thickness of about 1 mm. The sheets are then classed according to the diffusivity results.

| Samples | Number of sheets | Thickness | Diffusivity [mm²/s] | Classification |
|---|---|---|---|---|
| GD310812-1 | 5 | 1.145 | 0.051 | 4 |
| GD310812-4 | 3 | 1.065 | 0.082 | 1 |
| GD310812-5 | 4 | 1.176 | 0.057 | 3 |
| 3382 | 5 | 1.150 | 0.040 | 7 |
| 3384 | 5 | 1.200 | 0.042 | 5 |
| GD280912-1 | 7 | 1.001 | 0.042 | 5 |
| GD280912-2 | 6 | 1.158 | 0.059 | 2 |

In the second test, the stacks contain each time seven sheets (therefore the same number of air layers). The thicknesses of the packages of paper are therefore different.

| Samples | Number of sheets | Thickness | Diffusivity [mm²/s] | Classification |
|---|---|---|---|---|
| GD310812-1 | 7 | 1.603 | 0.054 | 5 |
| GD310812-4 | 7 | 2.485 | 0.116 | 1 |
| GD310812-5 | 7 | 2.058 | 0.087 | 2 |
| 3382 | 7 | 1.610 | 0.046 | 6 |
| 3384 | 7 | 1.680 | 0.057 | 4 |
| GD280912-1 | 7 | 1.001 | 0.042 | 7 |
| GD280912-2 | 7 | 1.351 | 0.064 | 3 |

In the third and last test, the stacks contain at each time seven sheets (therefore the same number of air layers), the thicknesses of the packages are therefore different. The packages of paper were compressed between the fingers before they were positioned in the device.

| Samples | Number of sheets | Thickness | Diffusivity [mm²/s] | Classification |
|---|---|---|---|---|
| GD310812-1 | 7 | 1.603 | 0.057 | 4 |
| GD310812-4 | 7 | 2.485 | 0.134 | 1 |
| GD310812-5 | 7 | 2.058 | 0.085 | 2 |
| 3382 | 7 | 1.610 | 0.051 | 6 |
| 3384 | 7 | 1.680 | 0.056 | 5 |
| GD280912-1 | 7 | 1.001 | 0.045 | 7 |
| GD280912-2 | 7 | 1.351 | 0.085 | 2 |

The sheets GD310812-4, GD310812-5 and GD280912-2 have the best results and the sheets 3382 and GD280912-1 do not have good results.

EXAMPLE 13

Characterisation of the Thermal Properties (Thermal Diffusivity) of Sheets of Paper by Infrared Thermography The purpose of the tests is to evaluate the differences in thermal properties of the sheets, and in particular their thermal diffusivity on the surface (in XY) and in depth or in the mass (in Z). Infrared thermography is the study of the thermal behaviour of a component by measuring surface the temperature and its temporal and spatial variations.

The first tests (Test 1) consist in a temporal analysis. The samples are placed on a graphite plate and fixed using clamps. A camera is arranged 400 mm from the graphite plate. The lamps/graphite plate distance is 80 mm. Two IR 650 W lamps are spaced 45 mm. The whole is heated periodically (T=4 s, 6 s or 20 s) with an amplitude on the power of the lamps from 0 to 50% or 0 to 100%.

The strategy adopted was to classify the various paper according to their performance (low response time=best performance). As the papers have different thicknesses, another classification was carried out by taking into consideration the thickness of the papers: the thickness at the square was divided by the response time, which provides information over a magnitude proportional to the thermal diffusivity (response time=characteristic length at the square/thermal diffusivity).

The second tests (Test 2) consistent in an analysis in a stabilised regime. The conditions are the same as those during the temporal analysis. The setting on the graphite plate is set to 50° C.

The last tests (Test 3) consist in an analysis in XY. A perforated insulating plate is placed (via a graphite rod) on an infrared lamp (650 W). The hole is located above one of the two filaments of the lamp. The sample paper with sufficient dimensions (75*75 mm) is placed on two graphite rods. The lamp is set to 10% of its maximum power. The treatment consists of extracting the longitudinal profiles when the temperature peak of 60° C. is reached. Each sample received the same treatment, as the profile is always in the same location.

| Samples | Test 1, dephasing Thickness not taken into account Classification index | Test 1, dephasing Thickness taken into account Classification index | Test 2 Stabilised temperature Classification | Test 3 X Y Classification |
|---|---|---|---|---|
| 3382 | 3.75 | 4 | 6 | 6 |
| 3384 | 3 | 4 | 2 | 1 |
| GD280912-1 | 5.5 | 6 | 3 | 7 |

-continued

| Samples | Test 1, dephasing Thickness not taken into account Classification index | Test 1, dephasing Thickness taken into account Classification index | Test 2 Stabilised temperature Classification | Test 3 X Y Classification |
|---|---|---|---|---|
| GD280912-2 | 6.75 | 7 | 7 | 4 |
| GD310812-1 | 3.25 | 4 | 4 | 5 |
| GD310812-4 | 4 | 1.5 | 5 | 2 |
| GD310812-5 | 1.75 | 1.5 | 1 | 3 |

| Samples | General Classification |
|---|---|
| GD310812-5 | 1.8 |
| 3384 | 2.5 |
| GD310812-4 | 3.1 |
| GD310812-1 | 4.1 |
| 3382 | 5 |
| GD280912-1 | 5.4 |
| GD280912-2 | 6.2 |

The paper GD280912-1 seems to be one of the least best in the tests and the paper GD310812-4 seems to be one of the best in these tests (1st/2nd).

A second series of sheets was prepared and compared to a tracing paper and to a plastic PET film (cfu=carbon fibres).

| | | Paper weight (g/m$^2$) | Thickness (μm) | Bulk |
|---|---|---|---|---|
| VT_24.10.12.4 | 30% CaCO3 + calendaring | 210 | 173 | 0.8 |
| VT_24.10.12.6 | 30% CaCO3 + PVA impregnation + calendaring | 220 | 203 | 0.92 |
| VT_24.10.12.7 | 30% CaCO3 | 215 | 256 | 1.2 |
| VT_24.10.12.8 | 20% cf | 145 | 280 | 1.9 |
| VT_24.10.12.9 | 20% cf + calendaring | 142 | 180 | 1.27 |
| VT_24.10.12.10 | 20% cf + calendaring | 142 | 150 | 1.05 |
| VT_24.10.12.11 | 20% cf + PVA impregnation + calendaring | 183 | 261 | 1.43 |
| VT_25.10.12.1 | reference (fibres only) + calendaring | 157 | 133 | 0.85 |
| VT_25.10.12.2 | reference (fibres only) | 154 | 200 | 1.3 |
| Tracing | / | 230 | 170 | 0.74 |
| PT125 (PET) | / | | 125 | |

The paper PT125 seems to be one of the least best in the tests and the paper VT_24.10.12.9 seems to be one of the best.

The various tests have shown that the aluminium film made it possible to substantially improve the thermal diffusivity on the surface (x/y) of the sheet. With regards to the thermal diffusivity in depth (z), two parameters confirmed their very positive influence: the doping with carbon (fibres or fillers) and the calendaring of the papers in order to decrease the quantity of air.

The best result is therefore to dope a paper (for example with a thickness of 200 μm) with carbon, to calendar it then to insert an aluminium film (for example 12 μm thick) between the base layer (for example 12 μm thick) of the sheet and the paper.

The invention claimed is:

1. A method for producing a sheet comprising at least one electroconductive layer, said sheet comprising a substrate, wherein at least one side of the substrate is covered at least partially with a layer or several superimposed layers comprising the electroconductive layer, the method comprising the steps of:
    a/ preparing or providing a multi-layer structure comprising at least a plastic film, an anti-adhesive coating, and a base layer, with the anti-adhesive coating inserted between a side of the plastic film and the base layer;
    b/ applying an adhesive to at least one of (i) a side of the substrate and (ii) a side of the multi-layer structure located opposite to the plastic film, and applying said side of the substrate against said side of the multi-layer structure, so as to cross-laminate the multi-layer structure and the substrate;
    c/ removing the plastic film and the anti-adhesive coating from the base layer; and
    d/ covering the base layer with an electroconductive layer by printing the base layer with at least one ink having electrical properties, wherein the base layer is a printable layer having a binder base, wherein a ratio of the binder is greater than 15% in dry weight relative to the total dry matter weight of the base layer, then subjecting the printed sheet to an annealing heat treatment so as to form a layer of electroconductive ink,
    wherein step d/ is repeated at least once, and wherein each step d/ which follows another step d/ is separated from the other step d/ by an intermediary step of letting the sheet rest so as to substantially recover an initial humidity rate of the sheet.

2. The method according to claim 1, wherein the binder of the printable base layer comprises a main binder which is at least one of (i) a synthetic latex such as a styrene-butadiene copolymer (XSB) and (ii) a styrene-acrylate copolymer (SA).

3. The method according to claim 2, wherein the binder comprises a co-binder which is an adhesion promoter having an ethylene copolymer—acrylic acid (EAA) base.

4. The method according to claim 1, wherein the printable base layer is printed by ink jet, rotogravure, flexography, screen printing or offset.

5. The method according to claim 1, wherein the electroconductive ink comprises at least one of (i) metal nanoparticles or microparticles, (ii) nanoparticles or microparticles of carbon, and (iii) at least one conductive polymer.

6. The method according to claim 1, wherein the printable base layer comprises pigments.

7. The method according to claim 1, wherein the printable base layer is formed from at least two underlayers.

8. The method according to claim 1, wherein the sheet comprises at least one of (i) a metal film and (ii) a barrier layer having a base of polyurethane (PU), polyvinyl alcohol (PVA), polyvinylidene chloride (PVDC), vinyl acetate ethylene copolymer (EVAC), cellulose nanofibres, or metal, wherein the barrier layer is located between the substrate and the base layer.

9. The method according to claim 1, wherein the substrate is a tracing paper, and wherein the printable base layer has a transparency and a binder rate greater than 30% in dry weight relative to the total dry matter weight of the base layer.

10. The method according to claim 1, comprising, before the step d/, a step of heat pre-treatment of the sheet in order to remove at least a portion of water contained in the sheet.

11. The method according to claim 1, wherein the annealing is carried out in an oven, on a hot plate, a photon oven or in an infrared dryer.

12. The method according to claim 1, wherein the step d/ is preceded by a step of subjecting the base layer to a plasma treatment.

13. The method according to claim 1, wherein the adhesive used in step b) is a single-component or two-component polyurethane adhesive.

14. The method according to claim 1, wherein the substrate comprises fillers that result in at least one of (i) increasing a thermal diffusivity of the sheet, (ii) increasing a wet strength of the sheet, and (iii) making the sheet fire-retardant.

15. The method according to claim 1, wherein at least one of:
 (i) in the multi-layer structure prepared in step a), the base layer extends over a surface area less than a surface area of the side of the plastic film;
 (ii) the multi-layer structure and the substrate are cross-laminated in step b) over a surface area less than a surface area of the side of the sheet;
 (iii) the plastic film removed in step c) has at least one dimension selected from a length and a width thereof which is less than a corresponding dimension or dimensions of the side of the sheet; and
 (iv) the sheet obtained in step c) is cut in pieces, then at least one of the pieces cut from the sheet is glued onto the substrate of another sheet,
 in such a way so that the sheet comprises at least one side having at least one zone of greater smoothness than the rest of the side, the zone comprising a smooth external layer which is formed by the base layer and which extends on the substrate of the sheet over a surface area less than a surface area of said side.

16. The method according to claim 15, comprising, between the steps a) and b), a step of cutting the multi-layer structure.

17. The method according to claim 16, wherein at least one cut piece of the multi-layer structure is cross-laminated to the substrate in step b), and the plastic film and the anti-adhesive coating are removed from the glued piece, in step c).

18. The method according to claim 15, wherein the application of the multi-layer structure onto the substrate is carried out in step b) using a stamp press which applies a pressure in the zone, or using a hot foil stamp press which softens the adhesive used in step b), wherein the adhesive used in step b) is a heat-sensitive adhesive.

19. The method according to claim 15, wherein the plastic film of the multi-layer structure prepared in step a) has at least one dimension selected from a length and a width thereof which is less than a corresponding dimension or dimensions of the side of the sheet.

20. The method according to claim 15, wherein the sheet is produced on line in a paper machine, or off line in a paper cutting or finishing machine.

21. The method according to claim 15, comprising, before the step c), a step of printing the side of the multi-layer structure located opposite the plastic film with electroconductive inks, or of depositing an electroconductive coating on said side.

22. The method according to claim 15, wherein, during the step a), the anti-adhesive coating deposited onto the plastic film is printed with electroconductive inks or is covered with an electroconductive coating.

23. The method according to claim 15, wherein (iv) the sheet obtained in step c) is cut in pieces, then at least one of the pieces cut from the sheet is glued onto the substrate of another sheet, and wherein the sheet to be cut or the cut piece is printed with electroconductive inks or is covered with an electroconductive coating, before the gluing onto the substrate of the other sheet.

24. The method for producing an electroconductive product comprising producing, using an electroconductive sheet obtained by the method according to claim 1, at least one component selected from a resistor, a capacitor, a transistor, an RFID chip, a logic circuit, a membrane switch (SWITCH), a photovoltaic cell, a battery, a means for collecting energy, a backlighting system, a means of solid-state lighting or display such as an organic or inorganic light-emitting diode (OLED), a membrane keyboard, a sensor, and combinations thereof.

* * * * *